United States Patent
Morita et al.

(10) Patent No.: US 10,128,552 B2
(45) Date of Patent: Nov. 13, 2018

(54) STRUCTURE AND ELECTRONIC CIRCUIT

(71) Applicant: CANON KABUSHIKI KAISHA, Tokyo (JP)

(72) Inventors: Jun Morita, Tokyo (JP); Hajime Shimura, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 37 days.

(21) Appl. No.: 14/995,436

(22) Filed: Jan. 14, 2016

(65) Prior Publication Data

US 2016/0211563 A1 Jul. 21, 2016

(30) Foreign Application Priority Data

Jan. 20, 2015 (JP) ................. 2015-008954

(51) Int. Cl.
*H01P 1/203* (2006.01)
*H01P 1/20* (2006.01)
*H03H 1/00* (2006.01)

(52) U.S. Cl.
CPC ............ *H01P 1/2005* (2013.01); *H01P 1/203* (2013.01); *H01P 1/20345* (2013.01); *H03H 2001/0085* (2013.01)

(58) Field of Classification Search
CPC ............. H03H 2001/0085; H01P 1/203; H01P 1/20345; H01P 1/2005
USPC ................................................ 333/185, 204
See application file for complete search history.

(56) References Cited

U.S. PATENT DOCUMENTS

| | | | |
|---|---|---|---|
| 8,760,242 B2 * | 6/2014 | Tamaru | H03H 7/09 333/176 |
| 2002/0093397 A1 * | 7/2002 | Nosaka | H03H 7/09 333/185 |
| 2011/0186341 A1 * | 8/2011 | Kobayashi | H01P 1/20345 174/266 |
| 2011/0267156 A1 * | 11/2011 | Nakamura | H01P 1/20381 333/204 |
| 2015/0061791 A1 * | 3/2015 | Imamura | H03H 7/09 333/185 |
| 2015/0214630 A1 | 7/2015 | Shimura | |
| 2016/0104927 A1 | 4/2016 | Morita | |

FOREIGN PATENT DOCUMENTS

| JP | 2002-510886 A | 4/2002 |
|---|---|---|
| JP | 2010-199881 A | 9/2010 |
| WO | 99/050929 A1 | 10/1999 |

* cited by examiner

*Primary Examiner* — Rakesh Patel
(74) *Attorney, Agent, or Firm* — Carter, DeLuca, Farrell & Schmidt, LLP

(57) ABSTRACT

A structure which cuts off propagation of an electromagnetic wave at one or more frequencies is provided. The structure comprises linear third conductors arranged on a plurality of different layers different from a first layer of a substrate including the first layer where a first conductor is formed and a second layer where a second conductor is formed, and at least one fourth conductor configured to connect one end of one conductor out of the third conductors to one end of another conductor out of the third conductors. At least one of the third conductors has a curved shape.

6 Claims, 20 Drawing Sheets

PRIOR ART

PRIOR ART

F I G. 11A
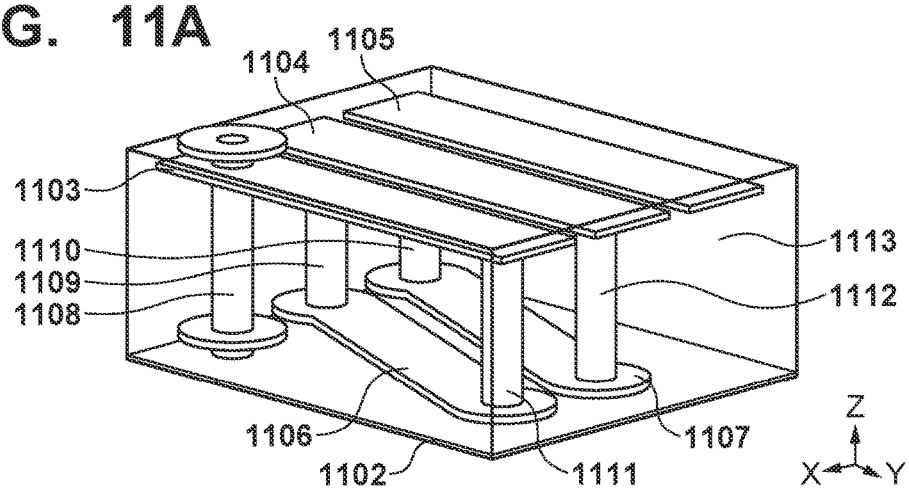
F I G. 11B
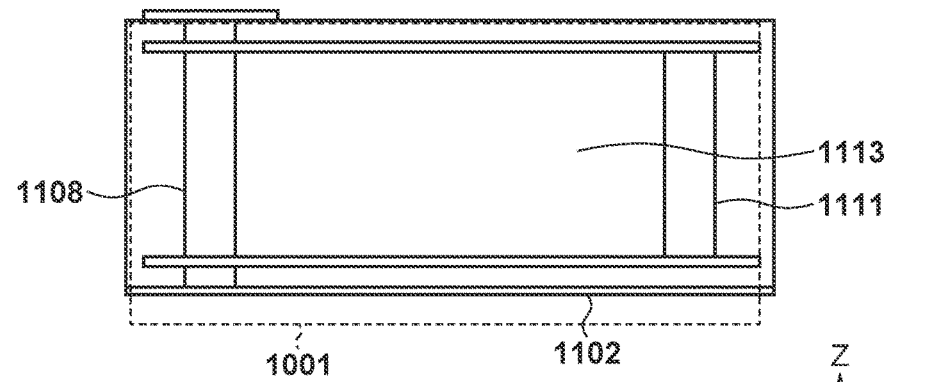
F I G. 11C
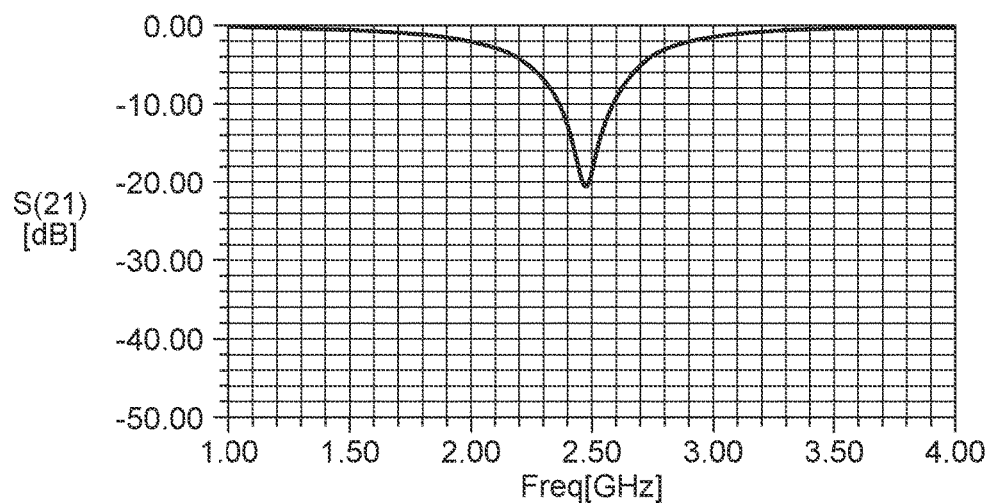

STRUCTURE AND ELECTRONIC CIRCUIT

BACKGROUND OF THE INVENTION

Field of the Invention

The present invention relates to an Electromagnetic Band Gap (EBG) structure.

Description of the Related Art

In recent years, an electromagnetic band gap structure which prevents propagation of an electromagnetic wave in a specific frequency band has been examined. Japanese Patent Laid-Open No. 2002-510886 describes an electromagnetic band gap structure of a mushroom structure in which patch conductors are arranged at a predetermined gap interval in an array pattern on the same plane, and the patch conductors and a ground conductor parallel to the patch conductors are connected by a conductor via. Japanese Patent Laid-Open No. 2010-199881 describes an electromagnetic band gap structure which includes two conductor plates disposed in parallel and a unit structure in which an open stub formed in a region not between the two conductor plates is included as a part thereof.

In general, an electronic device needs to be smaller in size, so does an electric circuit substrate of the electronic device. In addition, parts, a circuit pattern, and the like mounted on the electric circuit substrate also need to be smaller in size. However, the electromagnetic band gap structure does not achieve a satisfactory size enough to implement a compact electric circuit substrate yet.

The present invention reduces the size of the electromagnetic band gap structure.

SUMMARY OF THE INVENTION

According to one aspect of the present invention, there is provided a structure which cuts off propagation of an electromagnetic wave at one or more frequencies, the structure comprising: linear third conductors arranged on a plurality of different layers different from a first layer of a substrate including the first layer where a first conductor is formed and a second layer where a second conductor is formed; and at least one fourth conductor configured to connect one end of one conductor out of the third conductors to one end of another conductor out of the third conductors, wherein at least one of the third conductors has a curved shape.

According to another aspect of the present invention, there is provided a structure which cuts off propagation of an electromagnetic wave at one or more frequencies, the structure comprising: a plurality of third conductors arranged on a third layer different from a first layer of a substrate including the first layer where a first conductor is formed and a second layer where a second conductor is formed; at least one fourth conductor arranged on a fourth layer different from the first layer and the third layer; and a plurality of fifth conductors configured to connect one end of one conductor out of the plurality of third conductors to one end of one conductor out of the at least one fourth conductor and connect one end of another conductor out of the plurality of third conductors to the other end of the one conductor out of the at least one fourth conductor.

According to still another aspect of the present invention, there is provided an electronic circuit comprising: a first conductor configured to form a signal line; a second conductor configured to form ground; and a structure configured to cut off propagation of an electromagnetic wave at one or more frequencies, wherein the structure includes linear third conductors arranged on a plurality of different layers different from a first layer of a substrate including the first layer where the first conductor is formed and a second layer where the second conductor is formed, and at least one fourth conductor configured to connect one end of one conductor out of the third conductors to one end of another conductor out of the third conductors, and at least one of the third conductors has a curved shape.

According to yet another aspect of the present invention, there is provided an electronic circuit comprising: a first conductor configured to form a signal line; a second conductor configured to form ground; and a structure configured to cut off propagation of an electromagnetic wave at one or more frequencies, wherein the structure includes a plurality of third conductors arranged on a third layer different from a first layer of a substrate including the first layer where the first conductor is formed and a second layer where the second conductor is formed; at least one fourth conductor arranged on a fourth layer different from the first layer and the third layer; and a plurality of fifth conductors configured to connect one end of one conductor out of the plurality of third conductors to one end of one conductor out of the at least one fourth conductor and connect one end of another conductor out of the plurality of third conductors to the other end of the one conductor out of the at least one fourth conductor.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 11A to 11C are a schematic view and a sectional view showing a unit cell structure according to the third configuration example, and a graph showing a transmission coefficient S21;

DESCRIPTION OF THE EMBODIMENTS

An exemplary embodiment(s) of the present invention will now be described in detail with reference to the drawings. It should be noted that the relative arrangement of the components, the numerical expressions and numerical values set forth in these embodiments do not limit the scope of the present invention unless it is specifically stated otherwise.

An electronic circuit substrate is generally formed by a plurality of layers. For example, in the case of a transmission line such as a microstrip line, a signal line and a ground conductor of different layers are arranged, and a signal is transmitted in the signal line. In this case, however, noise may be mixed in the signal line and noise may also propagate through the electronic circuit substrate. To cope with this, an Electromagnetic Band Gap (EBG) structure can suppress a component in a specific frequency band of noise mixed in the signal line. This makes it possible to effectively suppress, for example, noise originated from a signal having a specific frequency. In an embodiment below, several examples of a compact EBG structure will be shown in consideration of the fact that a conventionally proposed EBG structure is not adequate in terms of miniaturization.

Figure 1A:
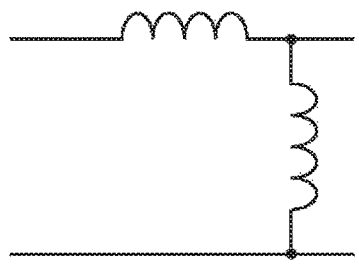
FIGS. 1A and 1B are views showing an equivalent circuit having an EBG structure.
Figure 1B:
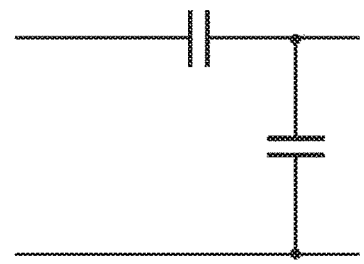

First, the operation principle of a general EBG structure will be described before describing the EBG structure according to this embodiment. The EBG structure which prevents propagation of an electromagnetic wave in a specific frequency band is implemented by a structure having an equivalent circuit as shown in FIG. 1A or 1B. In this embodiment, the structure having the equivalent circuit as shown in FIG. 1A will be described.

Figure 2A:
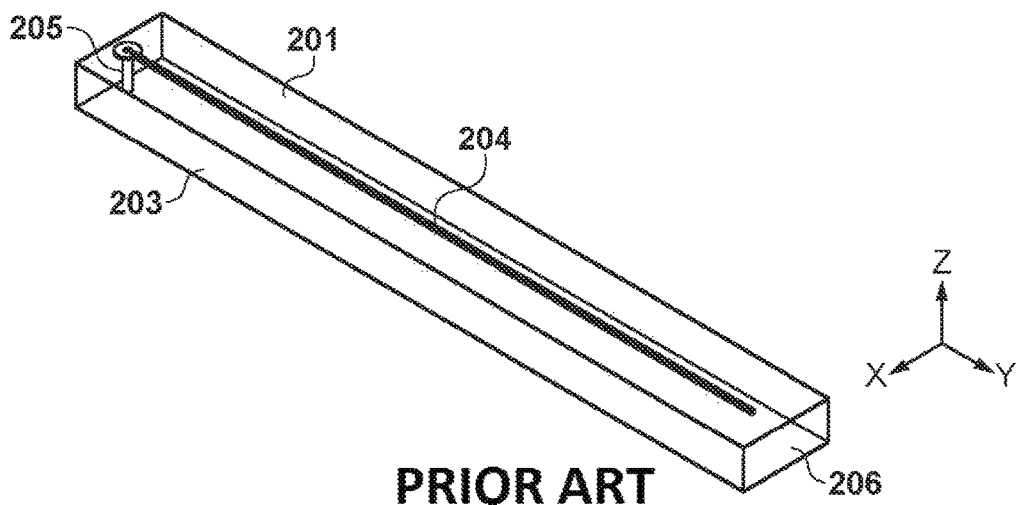
FIGS. 2A and 2B are a schematic view and a sectional view showing a conventional EBG structure.
Figure 2B:
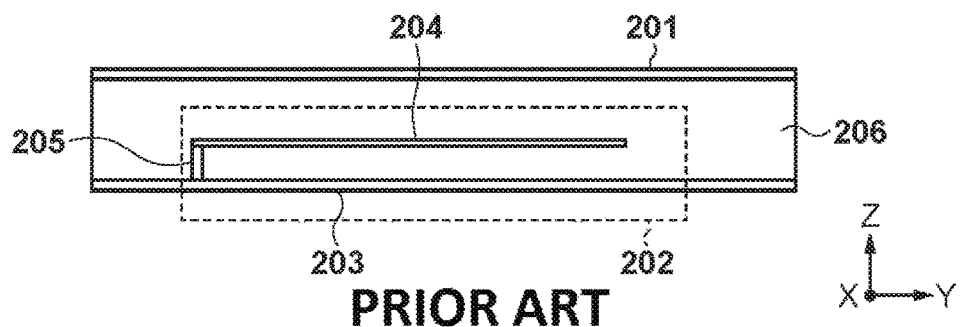

The equivalent circuit of FIG. 1A is implemented by the structure in which a conductor whose one end is connected to a ground conductor and the other end is an open end is arranged between a signal line and the ground conductor arranged in parallel. This will be described by using the conventional EBG structure. FIG. 2A is a schematic view showing the conventional EBG structure, and FIG. 2B is a sectional view when viewed from the Y-Z plane of the EBG structure in FIG. 2A. This EBG structure includes a conductor 204 whose one end is disposed on a layer different from a layer where a signal line 201 and a ground conductor 203 are arranged is an open end, a conductor via 205 which electrically connects the ground conductor 203 and one end which is not the open end of the conductor 204, and a dielectric 206. A structure obtained by removing the signal line and the dielectric from the EBG structure will be referred to as a unit cell structure hereinafter. For example, a conductor portion surrounded by a broken line in FIG. 2B is a unit cell structure 202.

An open stub formed by the conductor 204 and the conductor via 205 connected to the conductor 204 is arranged between the signal line 201 and the ground conductor 203. An impedance Z of the open stub is generally given by:

$$Z = -jZ_0 \frac{1}{\tan\beta d} \quad (1)$$

where $Z_0$ is a characteristic impedance, $\beta$ is a phase constant represented by $\beta=\lambda/2\pi$, d is a length of the open stub, and $\lambda$ is a wavelength.

Figure 3:
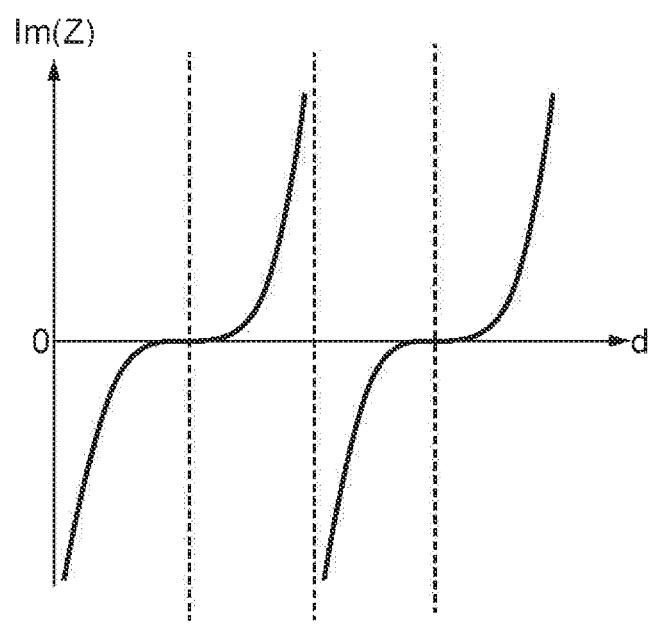
FIG. 3 is a graph showing the relationship between the length of an open stub and the imaginary part of an impedance.

FIG. 3 is a graph showing the relationship between the length of the open stub and values of the imaginary part of the impedance given by equation (1). As seen in FIG. 3, the positive and negative values in the imaginary part of the impedance are reversed. That is, such an open stub operates as an inductance when the imaginary part of the impedance is positive and operates as a capacitance when the imaginary part of the impedance is negative. That is, the open stub operates as the inductance or the capacitance in accordance with the length. The open stub showing this behavior is formed by the conductor 204 and the conductor via 205 in FIGS. 2A and 2B, and is arranged between the signal line 201 and the ground conductor 203. A parallel admittance part of the aforementioned equivalent circuit of FIG. 1A can be implemented by making the overall length of each of the conductor 204 and the conductor via 205 be a suitable length. A series impedance part of FIG. 1A can be implemented by an inductance component of the signal line 201 shown in FIGS. 2A and 2B. Therefore, the structure in FIGS. 2A and 2B has the equivalent circuit as shown in FIG. 1A and can operate as the EBG structure.

In this embodiment, several configuration examples of the structure to further reduce the size of the structure as shown in FIGS. 2A and 2B will be described.

FIRST CONFIGURATION EXAMPLE (Arrangement Example of Unit Cell Structure)

Figure 4A:
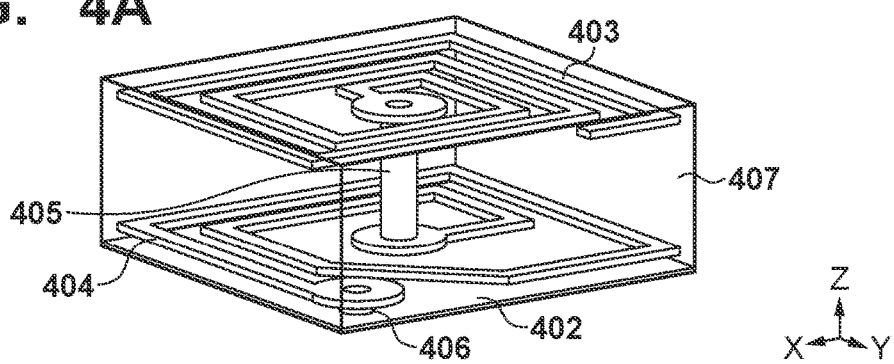
FIGS. 4A to 4D are schematic views and sectional views of unit cell structures according to the first configuration example.
Figure 4B:
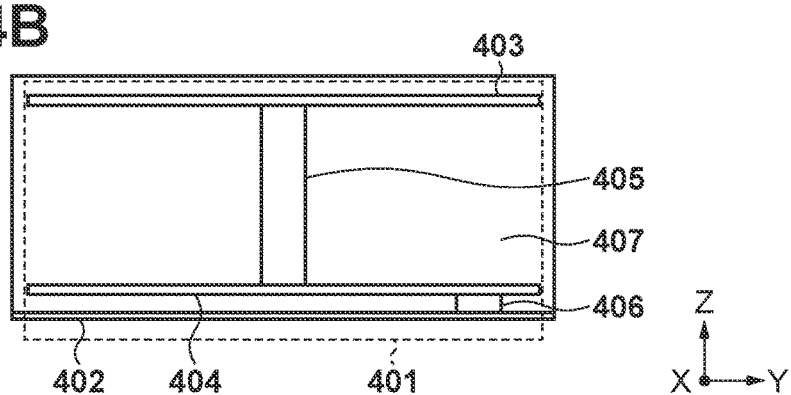
Figure 4C:
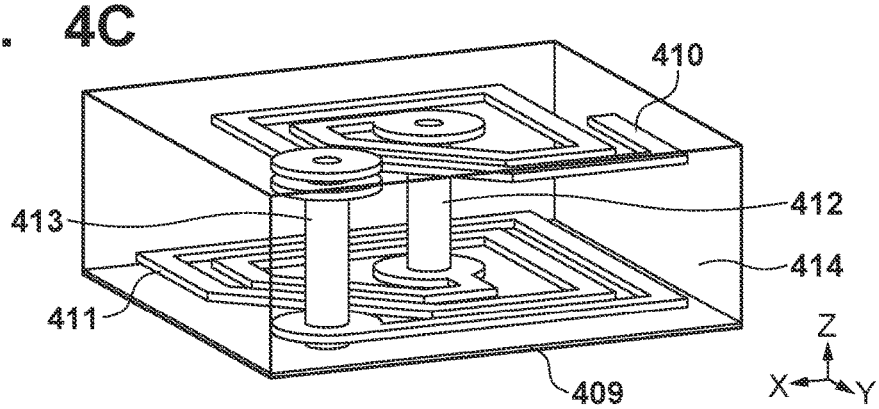
Figure 4D:
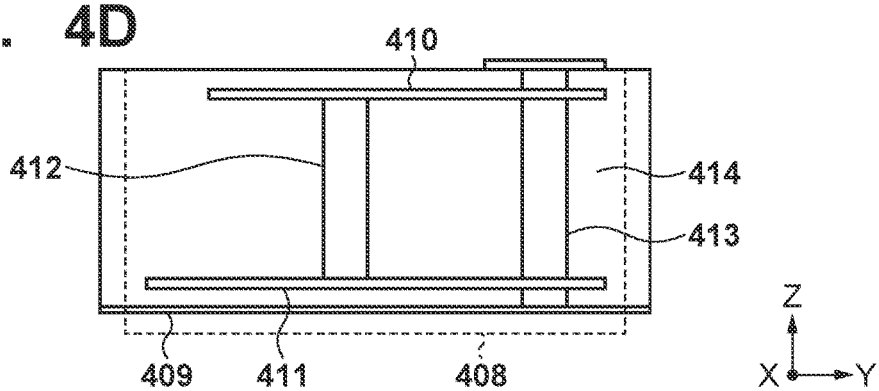

FIGS. 4A and 4B are views showing an arrangement example of a unit cell having an EBG structure. FIGS. 4C and 4D are views showing an arrangement example of another unit cell having the EBG structure. FIG. 4A is a schematic view illustrating the unit cell structure having the EBG structure formed on a 4-layer printed substrate. FIG. 4B is a sectional view when viewed from the Y-Z plane of the unit cell structure in FIG. 4A. A unit cell structure 401 includes a ground conductor 402, spiral conductors 403 and 404, and conductor vias 405 and 406. Further, the unit cell structure 401 is formed in a dielectric 407.

In this structure, the first spiral conductor 403 of the inner layer is connected to the second spiral conductor 404 of the inner layer by the conductor via 405, and the ground conductor 402 of the bottom layer is connected to the second spiral conductor 404 by the conductor via 406. That is, the conductor via 406, the second spiral conductor 404, the conductor via 405, and the first spiral conductor 403 are sequentially connected in series, and a conductor whose one end is connected to the ground conductor and the other end is an open end is formed over a plurality of layers.

Furthermore, FIGS. 4C and 4D show the arrangement example of the unit cell structure when the conductor via 406 is a through hole via in the structure of FIGS. 4A and 4B. It is possible to achieve a cost reduction by using the through hole via as the conductor via 406. FIG. 4C is a schematic view illustrating the unit cell structure. FIG. 4D is a sectional view when viewed from the Y-Z plane of the unit cell structure in FIG. 4C. A unit cell structure 408 includes a ground conductor 409, spiral conductors 410 and 411, an inner layer conductor via 412, and a through hole conductor via 413. Further, the unit cell structure 408 is formed in a dielectric 414.

For example, if the unit cell structure is designed to operate as an EBG in the 2.4-GHz band which is a frequency band used in a wireless LAN (that is, to cut off or attenuate propagation of the electromagnetic wave in the 2.4-GHz band), a conductor 204 has the length of 13 mm in the arrangement of FIGS. 1A and 1B. On the other hand, in the arrangement of FIGS. 4C and 4D, if the unit cell structure is designed on a general FR-4 substrate having a 4-layer structure, the size of that cell unit structure suffices to be 1.6 mm×1.6 mm. As described above, it is possible to ensure the line length of the conductor in the EBG structure while reducing areas on substrates where the structures shown in FIGS. 4A to 4D are formed.

Figure 5A:
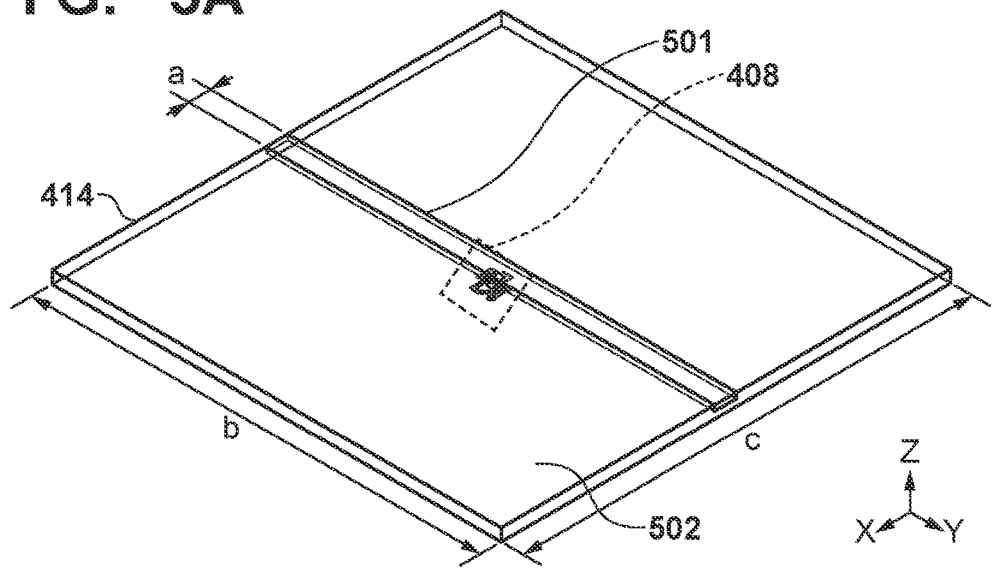
FIGS. 5A to 5C are a schematic view and a sectional view showing an electronic circuit in which the unit cell structure of FIGS. 4C and 4D is arranged, and a graph showing a transmission coefficient S21.
Figure 5B:
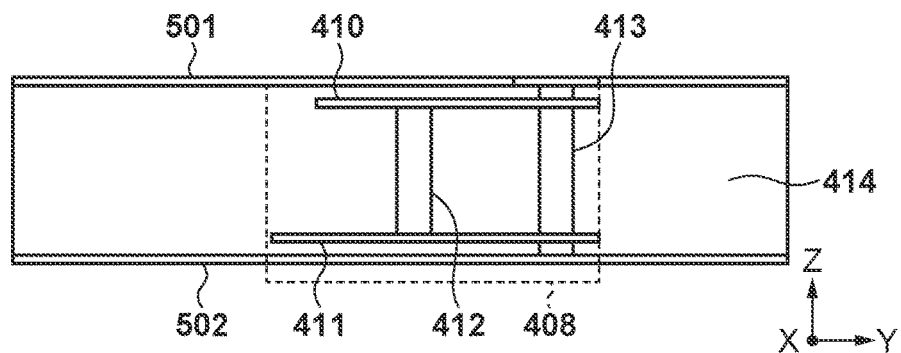

FIGS. 5A and 5B shows the arrangement in which the unit cell structure 408 is arranged under the line of a signal line 501. The unit cell structure 408 is formed in the dielectric 414. Note that the unit cell structure 408 designed to operate as the EBG in the 2.4-GHz band (that is, to cut off or attenuate propagation of the electromagnetic wave in the 2.4-GHz band) is used. FIG. 5A is a schematic view showing the unit cell structure 408 arranged under the line of the signal line, and FIG. 5B is an enlarged sectional view of FIG. 5A. Note that the signal line 501 and the unit cell structure 408 are arranged so as not to conduct to each other. Note that the signal line 501 is set to have a conductor width a of about 1.5 mm such that a characteristic impedance is about 50Ω in the 2.4-GHz band and a length b of 30 mm. A ground conductor 502 is set to have the conductor width b and a conductor width c both of which are 30 mm. A substrate thickness is set to be about 0.8 mm.

Figure 5C:
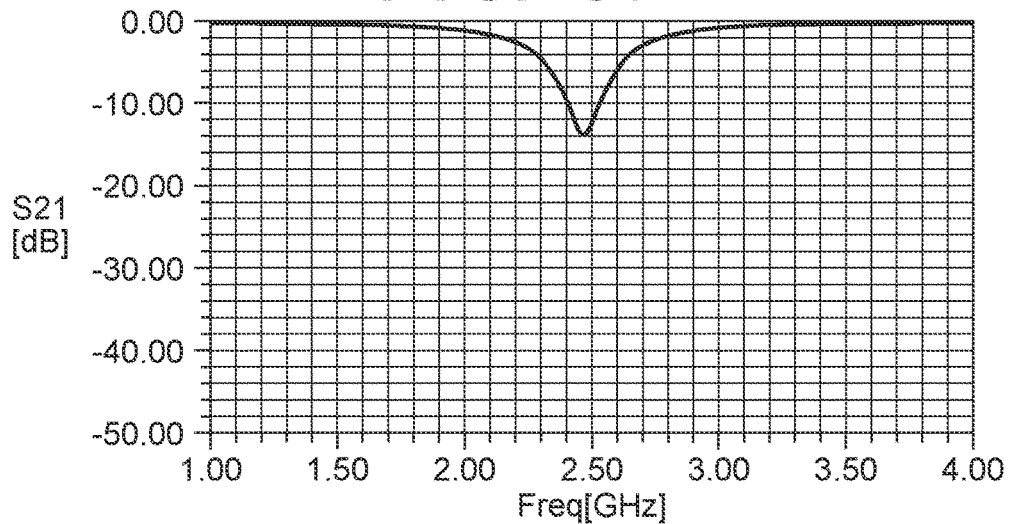

FIG. 5C shows the analysis result of a transmission coefficient S21 of an electromagnetic wave which propagates through the signal line 501 in the Y-axis direction at this time. As seen in FIG. 5C, in the arrangement of FIGS. 5A and 5B, the electromagnetic wave in the 2.4-GHz band which propagates through the signal line has the transmission coefficient S21 of about −10 dB and is attenuated sufficiently as intended by the design.

The unit cell structure 408 shown in FIGS. 4C and 4D uses the inner layer conductor via 412. However, the through hole via may be used. Note that when the unit cell structure 408 is arranged under the signal line of the electronic circuit substrate as shown in FIGS. 5A and 5B, clearances may be provided for the signal line and the ground conductor so as to prevent the through hole via used in place of the inner layer conductor via 412 from conducting to the signal line 501 and the ground conductor 502.

In this configuration example, the spiral conductors of the two layers are formed on the substrate. However, further miniaturization is possible by using more layers and ensuring a line length on the same principle as described above. Furthermore, in this configuration example, a spiral shape is used as the shape of the conductor. However, the present invention is not limited to this. For example, a curved shape such as a meander shape may be formed by a plurality of layers such that the line length of the conductor can be ensured. Note that throughout this embodiment and the appended claims, the curved shape includes not only a shape such as an arcuate shape without a straight line portion, but also a shape such as the structure in FIGS. 4A to 4D which includes the straight line portion but curves in at least one point.

(Characteristic Adjustment Method by Arrangement Position of Unit Cell Structure)

An influence on the size of the unit cell structure, a cutoff frequency, and the transmission coefficient S21 caused by electromagnetic coupling which occurs between the unit cell structure and the signal line, and electromagnetic coupling which occurs between the unit cell structure and the ground conductor will now be exemplified. That is, the fact that it becomes possible to design an appropriate unit cell structure that matches a mounting condition by considering coupling between the unit cell structure and the signal line or the ground conductor will be exemplified.

Figure 6A:
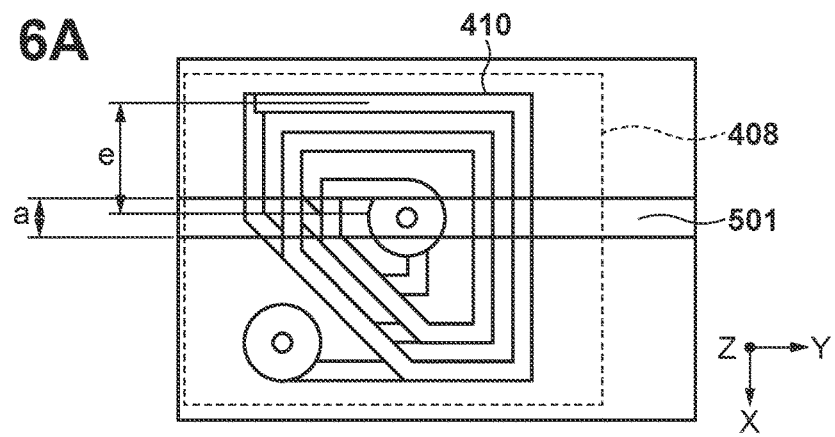
FIGS. 6A to 6C are an enlarged plan view showing the positional relationship between a signal line 501 and a unit cell structure 408, and graphs each showing the transmission coefficient S21.

A characteristic change when shifting the unit cell structure 408 with respect to the signal line 501 in the X-axis direction in the arrangement of FIGS. 5A and 5B will be described. FIG. 6A is an enlarged plan view in the vicinity of the unit cell structure 408 of FIG. 5A. As shown in FIG. 6A, let e be a distance between the open end of the spiral conductor 410 in the unit cell structure 408 and the reference point of the signal line 501 in the X-axis direction. The conductor width a of the signal line 501 is 0.2 mm. As seen in FIG. 6A, the distance between the open end of the unit cell structure 408 and the reference point of the signal line 501 in the X-axis direction becomes closer as the distance e is smaller.

Figure 6B:
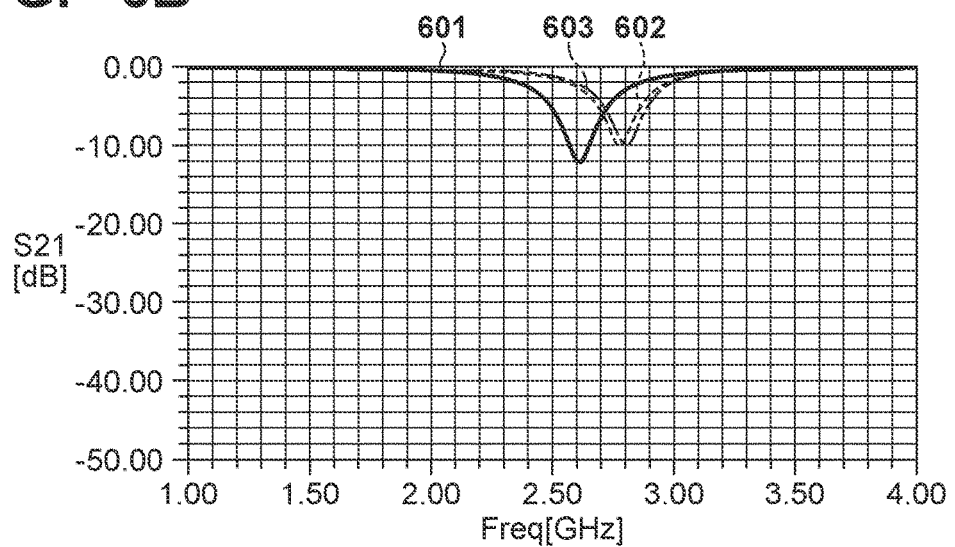

FIG. 6B shows the analysis result of the transmission coefficient S21 of the electromagnetic wave which propagates through the signal line 501 in the Y-axis direction when changing the distance e to 0 mm, 0.3 mm, and 0.6 mm. In FIG. 6B, curves denoted by reference numerals 601, 602, and 603, respectively, indicate the analysis results when the distances e are 0 mm, 0.3 mm, and 0.6 mm. As seen in FIG.

6B, there has been no great change in an attenuation amount and the cutoff frequency when the distances e between the signal line 501 and the open end of the spiral conductor 410 in the unit cell structure 408 are 0.3 mm and 0.6 mm. However, when the distance e is 0 mm, that is, the open end is arranged between the signal line 501 and the ground conductor 502, the attenuation amount of the electromagnetic wave increases and the cutoff frequency moves to a low frequency band as compared with cases in which the distances e are 0.3 mm and 0.6 mm.

Electromagnetic coupling which occurs between the signal line 501 and the open end of the spiral conductor 410 in the unit cell structure 408 is related to this. That is, stronger electromagnetic coupling which occurs between the signal line 501 and the open end of the conductor 410 in the unit cell structure 408 makes it possible to obtain the larger attenuation amount of the electromagnetic wave, and it is also effective in moving the cutoff frequency to the low frequency band.

In general, electromagnetic coupling between two conductors becomes stronger as the distance between the two conductors is shorter. That is, in this configuration example, as the distance e between the signal line 501 and the open end of the spiral conductor 410 is shorter, electromagnetic coupling which occurs between the signal line 501 and the open end of the spiral conductor 410 becomes stronger. As a result, as the distance e between the signal line 501 and the open end of the spiral conductor 410 is shorter, the attenuation amount of the electromagnetic wave increases and the cutoff frequency moves to the low frequency band. Note that "electromagnetic coupling" here includes electrostatic coupling (capacitive coupling), magnetic coupling (inductive coupling), or electromagnetic coupling in which both of these are mixed. An expression "electromagnetic coupling" which includes these states is used throughout this embodiment and the appended claims.

Figure 6C:
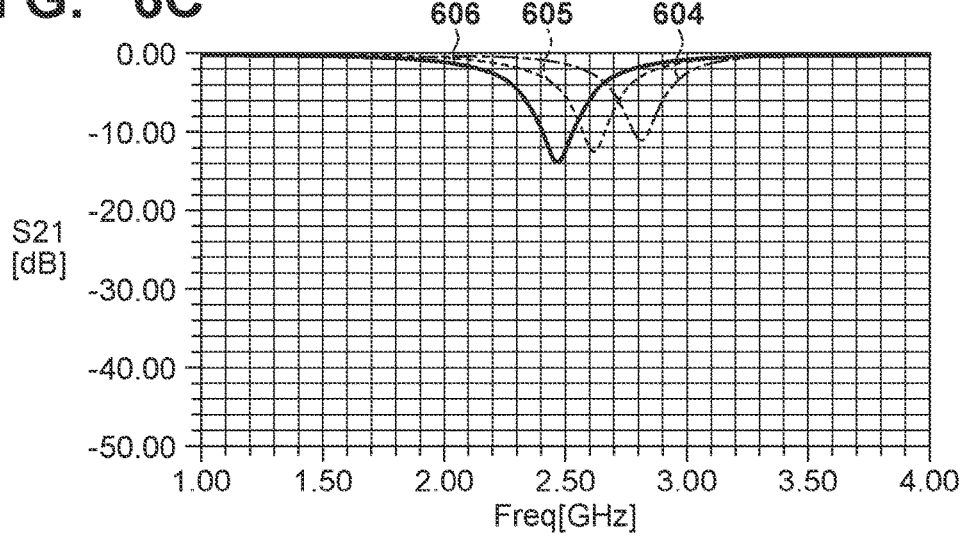

FIG. 6C shows the transmission coefficient S21 of the electromagnetic wave which propagates through the signal line 501 in the Y-axis direction when the conductor width a of the signal line 501 shown in FIGS. 5A and 5B is changed to 0.5 mm, 1 mm, and 1.52 mm. In FIG. 6C, curves denoted by reference numerals 604, 605, and 606, respectively, indicate the analysis results when the conductor widths a are 0.5 mm, 1 mm, and 1.52 mm.

As seen in FIG. 6C, as the conductor width a of the signal line 501 increases, the attenuation amount increases and the cutoff frequency moves to the low frequency band. Electromagnetic coupling which occurs between the signal line 501 and the open end of the spiral conductor 410 in the unit cell structure 408 is also related to this. That is, stronger electromagnetic coupling which occurs between the signal line 501 and the open end of the conductor 410 in the unit cell structure 408 makes it possible to obtain the larger attenuation amount of the electromagnetic wave, and it is also effective in moving the cutoff frequency to the low frequency band. In general, when the distance between two conductors is constant, electromagnetic coupling between the two adjacent conductors becomes stronger as an area increases. In this configuration example, as the area obtained by moving the signal line 501 and the open end of the spiral conductor 410 close to each other, that is, the conductor width of the signal line 501 is larger, electromagnetic coupling which occurs between the signal line 501 and the open end of the spiral conductor 410 becomes stronger. Then, according to this, as the conductor width of the signal line 501 is larger, the attenuation amount of the electromagnetic wave increases and the cutoff frequency moves to the low frequency band. In the above-described example, a case in which the conductor width of the signal line 501 is increased has been described. However, the same effect as this can also be obtained by increasing the conductor width in proximity to the open end of the spiral conductor 410. Since the open end is a portion where an electric field concentrates, and thus large electromagnetic coupling is obtained easily, the description here has been made by taking electromagnetic coupling in the proximity of the open end of the spiral conductor 410 as an example. It is possible, however, to obtain electromagnetic coupling in a portion other than a portion in proximity to the open end and adjust the characteristic as the EBG structure by adjusting that electromagnetic coupling.

As described above, electromagnetic coupling which occurs between the signal line 501 and the open end of the spiral conductor 410 can be increased by, for example, reducing the distance between the signal line 501 and the open end of the conductor 410 or increasing the area of a portion where they move close to each other. Then, it is possible to increase the attenuation amount of the electromagnetic wave by the EBG structure and move the cutoff frequency to the low frequency band by increasing electromagnetic coupling. It is therefore possible to obtain the sufficient attenuation amount of the electromagnetic wave at a desired cutoff frequency by, for example, adjusting the arrangement of the unit cell structure.

Similarly, in another arrangement below, the magnitude of electromagnetic coupling between the signal line and the unit cell structure is adjusted by changing the position of the unit cell structure. As a result, the cutoff frequency and the attenuation amount of the electromagnetic wave can be adjusted.

SECOND CONFIGURATION EXAMPLE

In the first configuration example, the unit cell structure in which the layer where the open end of the spiral conductor 410 is formed moves closer to the layer where the signal line 501 is arranged has been described. In this configuration example, a unit cell structure in which a layer where the open end of a conductor 410 is formed moves closer to a layer where a ground conductor is formed will be described.

Figure 7A:
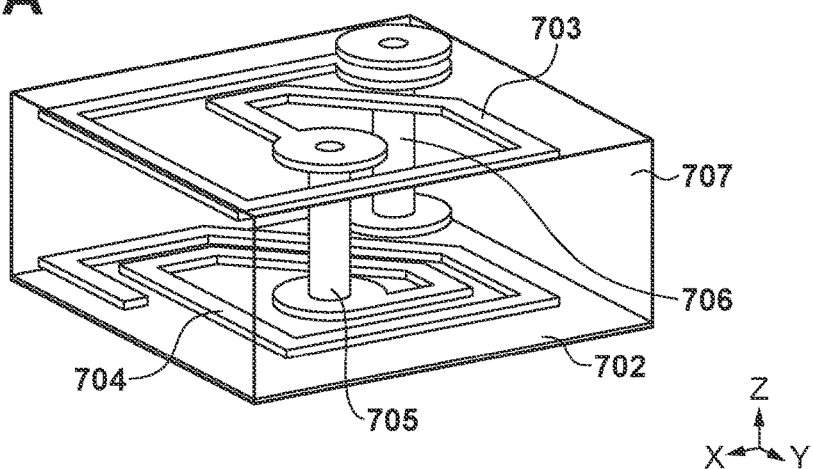
FIGS. 7A to 7C are a schematic view and a sectional view showing a unit cell structure according to the second configuration example, and a graph showing a transmission coefficient S21.
Figure 7B:
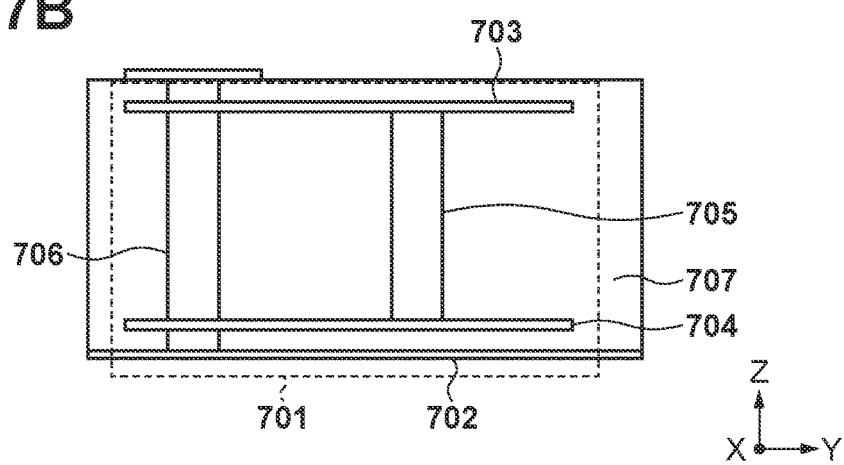

FIGS. 7A and 7B are views showing the unit cell structure according to this configuration example. FIG. 7A is a schematic view showing the unit cell structure according to this configuration example. FIG. 7B is a sectional view when viewed from the Y-Z plane of the structure in FIG. 7A. A unit cell structure 701 includes a ground conductor 702, spiral conductors 703 and 704, and conductor vias 705 and 706. Further, the unit cell structure 701 is formed in a dielectric 707.

The first spiral conductor 704 of the inner layer is connected to the second spiral conductor 703 of the inner layer by the conductor via 705. The ground conductor 702 of the bottom layer is connected to the second spiral conductor 703 of the inner layer by the conductor via 706. A structure in which the conductor via 706, the second spiral conductor 703 of the inner layer, the conductor via 705, and the first spiral conductor 704 of the inner layer are sequentially connected in series is obtained. This allows miniaturization while ensuring a line length. A unit cell in the second configuration example is different from that in the first configuration example in that the first spiral conductor 704 is formed of a layer closer to the layer of the ground conductor 702 than a layer where a signal line is formed, that is, the open end of the first spiral conductor 704 is close to the ground conductor 702.

If the structure in FIGS. 7A and 7B is designed, on a general FR-4 substrate having a 4-layer structure as in the first configuration example, to operate as an EBG in 2.4 GHz of a wireless LAN frequency band, the size of the unit cell structure can be 1.6 mm×1.4 mm. Thus, it is found that the structure in FIGS. 7A and 7B is reduced in size as compared with a unit cell structure shown in FIGS. 4C and 4D.

Figure 7C:
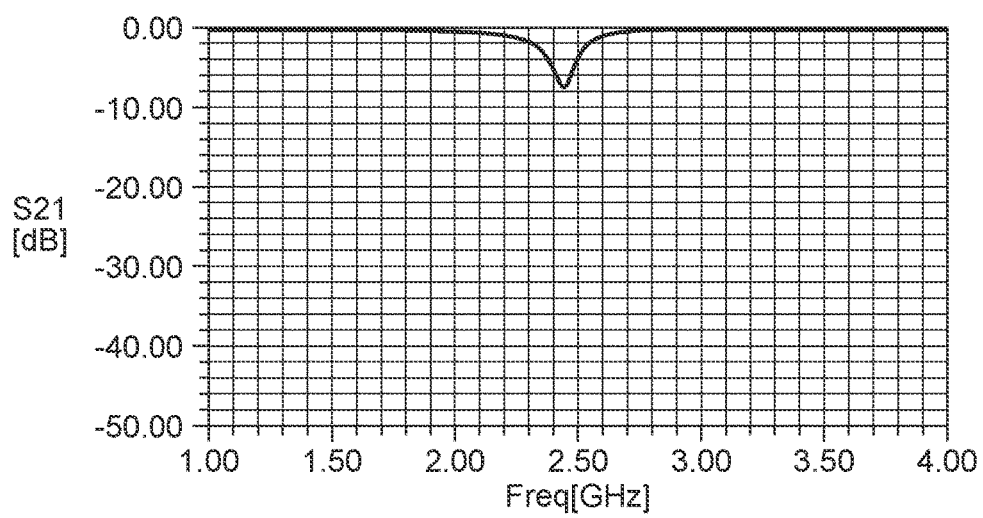

FIG. 7C shows the analysis result of a transmission coefficient S21 of an electromagnetic wave which propagates through a signal line 501 in the Y-axis direction when the unit cell is arranged under the signal line 501. Note that the analysis result in FIG. 7C is a result in which a signal line width, a ground conductor width, and a substrate thickness are obtained on the same condition as the condition described in the first configuration example with reference to FIGS. 5A to 5C. Comparing the analysis results between FIG. 5C and FIG. 7C, it is found that the transmission coefficient S21 in the 2.4-GHz band of FIG. 7C is larger by about 7 dB, that is, the electromagnetic wave is cut off more in the first configuration example.

In a unit cell structure 408 shown in FIGS. 4C and 4D, since an open end where electric field energy concentrates exists in the proximity of the signal line 501, large electromagnetic coupling is obtained between the open end and the signal line 501. In contrast, in the unit cell structure shown in FIGS. 7A and 7B, since the open end where electric field energy concentrates exists in the proximity of the ground conductor 702, large electromagnetic coupling is obtained between the open end and the ground conductor 702. Thus, it is considered that although the cutoff ability of the electromagnetic wave is lower, further miniaturization becomes possible in the unit cell structure of FIGS. 7A and 7B than in the unit cell structure of FIGS. 4C and 4D.

As described above, the structure in FIGS. 7A and 7B implements an EBG structure in which miniaturization is achieved even though the attenuation amount of the electromagnetic wave is not large. This makes it possible to meet, as a specification required for the EBG structure or the like, a demand to reduce the size of the unit cell structure no matter the attenuation amount is small to some extent. That is, as the EBG structure in an electronic circuit, the structure in FIGS. 4C and 4D can be employed when there is no strong constraint on the size but the larger attenuation amount of the electromagnetic wave is desired, while the structure in FIGS. 7A and 7B can be employed when the attenuation amount can be small but there is the strong constraint on the size.

In each arrangement of FIGS. 4A to 4D, and FIGS. 7A and 7B, all the spiral conductors are arranged between the layer where the ground conductor is formed and the layer where the signal line is formed. However, the present invention is not limited to this. For example, conductors 404, 411, and 704 may be formed of the same layer as the layer where the ground conductor is formed. This makes it possible to reduce the number of layers required to implement the EBG structure.

(Relationship between Direction of Conductor and Cutoff Frequency)

In the first and second configuration examples described above, the structure of the unit cell structure having the EBG structure when the rotation directions of the spiral conductors formed of two layers are the same has been exemplified. The influence of these rotation directions on the characteristic of the unit cell structure will now be described. A structure in FIGS. 8A and 8B will be used for a descriptive purpose.

Figure 8A:
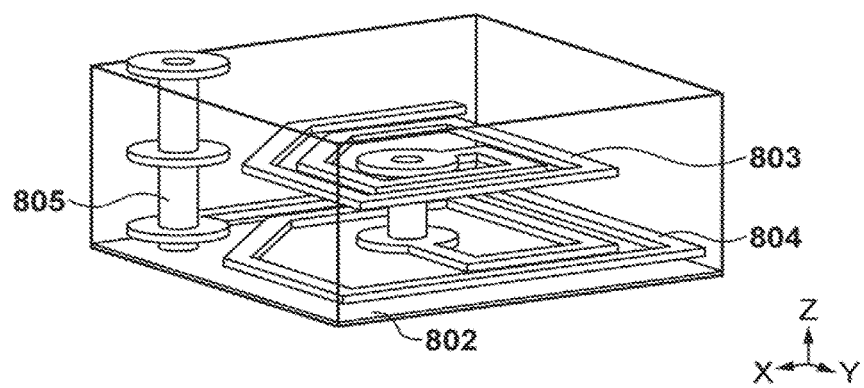
FIGS. 8A to 8C are schematic views showing unit cell structures, and a graph showing the transmission coefficient S21.

FIG. 8A is a view showing a unit cell structure in which the rotation directions of spiral conductors formed of two layers are the same. In FIG. 8A, considering a direction from a point where a second spiral conductor 804 is connected to a conductor via 805 to the open end of a first spiral conductor 803, the rotation directions of the first spiral conductor 803 and the second spiral conductor 804 are the same.

Figure 8B:
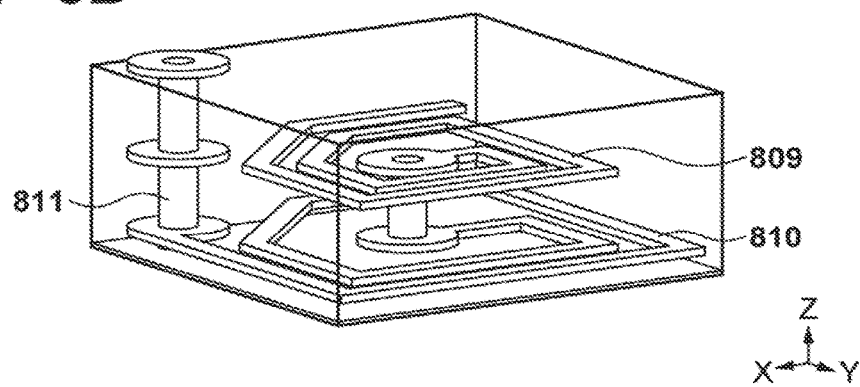

On the other hand, FIG. 8B is a view showing the unit cell structure in which the rotation directions of spiral conductors formed of two layers are opposite each other. Note that the overall length obtained by combining the respective conductors of the unit cell structure in FIG. 8B is configured so as to be almost the same as the overall length obtained by combining the respective conductors of FIG. 8A. In FIG. 8B, considering a direction from a point where a second spiral conductor 810 is connected to a conductor via 811 to the open end of a first spiral conductor 809, the rotation directions of the first spiral conductor 809 and the second spiral conductor 810 are opposite each other.

Note that in FIGS. 8A and 8B, a distance between the spiral conductors formed of the respective layers, that is, a distance between the layers is shorter than in the structures of the first and second configuration examples such that a difference in characteristics owing to the rotation directions of the spiral conductors formed of the respective layers of the unit cell structure can be understood more clearly.

Figure 8C:
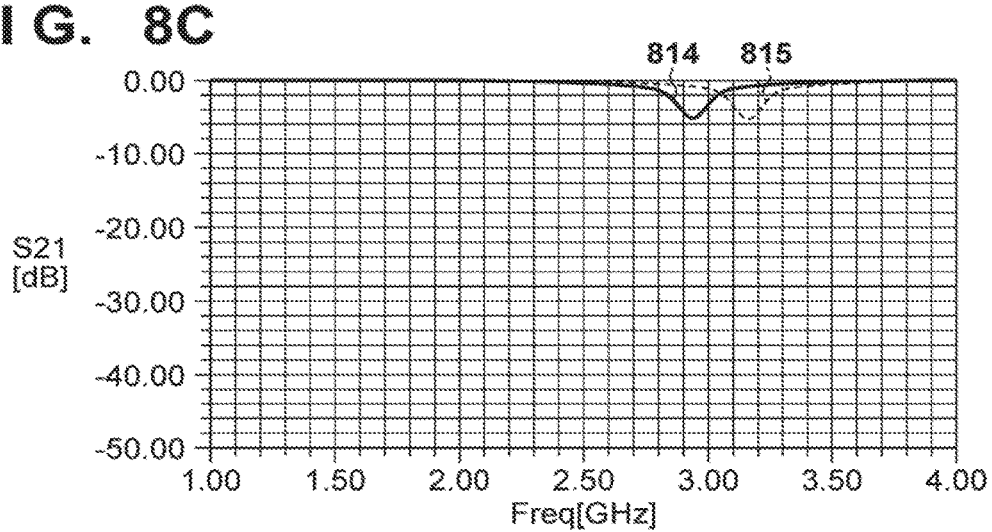

FIG. 8C shows the analysis result of the transmission coefficient S21 of the electromagnetic wave which propagates through the signal line 501 in the Y-axis direction when each unit cell structure of FIGS. 8A and 8B is arranged under the signal line as in FIGS. 5A and 5B. Note that in this analysis, the same values as the values described in the first configuration example are used as the signal line width, the ground conductor width, and the substrate thickness. In FIG. 8C, a curve denoted by reference numeral 814 indicates the analysis result when the unit cell structure of FIG. 8A is arranged, and a curve denoted by reference numeral 815 indicates the analysis result when the unit cell structure of FIG. 8B is arranged.

As seen in FIG. 8C, the unit cell structure in FIG. 8A has a cutoff frequency on a lower frequency band side than the unit cell structure in FIG. 8B. That is, between FIGS. 8A and 8B, although the overall lengths obtained by combining the respective conductors of the unit cell structures are almost the same, the cutoff frequencies are different because of a difference in the rotation directions of the spiral conductors formed of the respective layers. More specifically, it is possible, in the structure of FIG. 8A, to design the EBG structure having a smaller line length than in the structure of FIG. 8B and the same cutoff frequency.

In the arrangement of FIG. 8A, since the respective rotation directions of the two spiral conductors 803 and 804 are the same, the directions of electric currents which flow through the overlapping two spiral conductors will also be the same in the proximity of a frequency band where the structure operates as the EBG. Thus, the directions of magnetic fields formed by the respective conductors when the electric currents flow will also be the same. This produces an effect of the conductors enhancing each other's magnetic fields and increases an inductance component effectively. On the other hand, since the respective rotation directions of the two spiral conductors 809 and 810 are opposite each other in the arrangement of FIG. 8B as described above, the directions of the electric currents which flow through the overlapping two spiral conductors will also be opposite each other in the proximity of the frequency band where the structure operates as the EBG. Thus, the directions of the magnetic fields formed by the respective conductors will also be opposite each other. As a result, the magnetic fields cancel each other and the inductance component is decreased as compared with the structure in FIG. 8A. Therefore, it is considered that the EBG structure having the smaller line length than in the structure of FIG. 8B and the same cutoff frequency can be designed by the structure of FIG. 8A.

As described above, it becomes possible to further reduce the size of the unit cell structure by matching the rotation directions in spiral conductor structures formed of the respective layers. An arrangement in which the directions of the electric currents will be the same by making the rotation directions of vectors in the spiral conductors equal to each other has been exemplified here. However, the present invention is not limited to this. For example, even if a shape such as a meander shape is employed, a relationship in which magnetic fields formed by linear conductors enhance each other is obtained by forming these linear conductors of a plurality of layers such that the electric current directions will be the same. This makes it possible to reduce the size of the EBG structure.

(Relationship between Arrangement and Characteristics of Plurality of Unit Cell Structures)

Figure 9A:
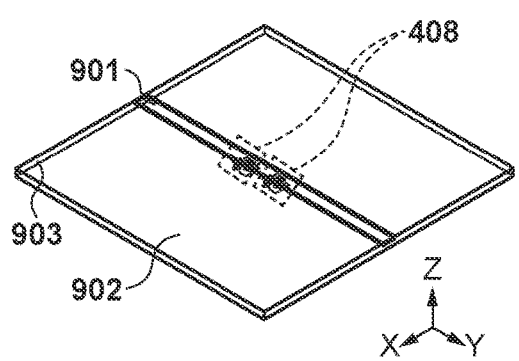
FIGS. 9A to 9D are a schematic view and a plan view showing the arrangement in which the unit cell structures of FIGS. 4C and 4D are arranged under a plurality of signal lines, and graphs each showing the transmission coefficient S21.
Figure 9B:
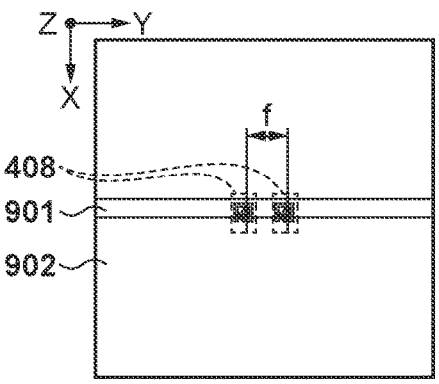

An influence on the attenuation amount given by the number and the interval of the above-described plurality of unit cell structures arranged under the signal line will now be evaluated. An arrangement shown in FIGS. 9A and 9B is used for the evaluation. FIG. 9A is a view in which the plurality of unit cell structures 408 shown in FIGS. 4C and 4D are arranged under a signal line 901 in the Y-axis direction. FIG. 9B is a plan view when the arrangement in FIG. 9A is viewed from the Z direction. As shown in FIGS. 9A and 9B, this arrangement includes the signal line 901, a ground conductor 902, a dielectric 903, and the plurality of unit cell structures 408.

Figure 9C:
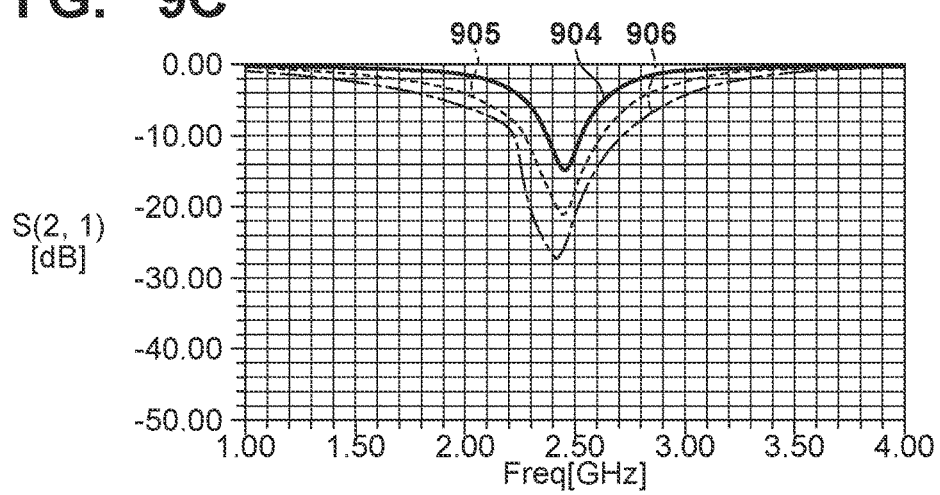

In FIGS. 9A and 9B, the two unit cell structures 408 are arranged under the signal line 901. However, the evaluation has been made by changing the number of these unit cell structures 408. FIG. 9C shows the analysis result of the transmission coefficient S21 of an electromagnetic wave which propagates through the signal line 901 in the Y-axis direction when the number of unit cell structures 408 is changed to one, two, and three. Curves denoted by respective reference numerals 904 to 906, respectively, indicate the analysis results when the numbers of unit cell structures to be arranged are one, two, and three. As seen in FIG. 9C, the attenuation amount of the electromagnetic wave increases by increasing the number of unit cell structures 408 in the Y-axis direction. As described above, it is possible to increase the attenuation amount of the electromagnetic wave in a specific frequency band that propagates through the signal line by increasing the number of unit cell structures arranged under the signal line.

Figure 9D:
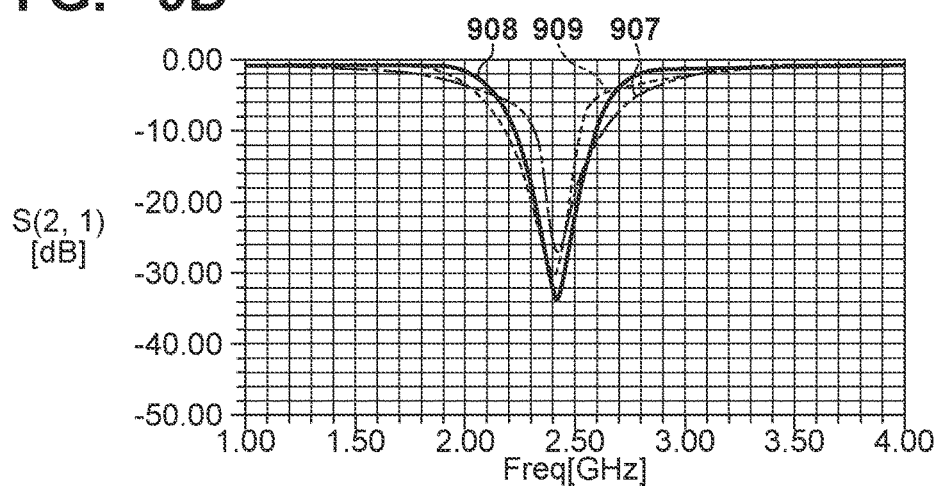

Next, as shown in FIG. 9B, the evaluation has been made by changing a distance f between the unit cell structures when the plurality of unit cell structures 408 are arranged. FIG. 9D shows the analysis result for the three different distances f. In FIG. 9D, curves denoted by respective reference numerals 907 to 909, respectively, indicate the analysis results of the transmission coefficient S21 of the electromagnetic wave which propagates through the signal line 901 in the Y-axis direction when the distances f between the unit cell structures are 3.6 mm, 18.0 mm, and 25.2 mm.

As seen in FIG. 9D, the characteristic of the analysis result (curve 908) when the distance f is 18.0 mm is that the attenuation amount in a desired frequency band is the largest, a better electromagnetic wave cutoff characteristic is obtained than another characteristic, and a passband characteristic is also superior to the other characteristics. It is considered that this is because when an electromagnetic wave in a desired cutoff frequency band propagates through the signal line between the unit cell structures, that signal line acts as an immittance inverter by making the distance between the unit cell structures be about a quarter of the length of an electrical length ($\lambda$) of the electromagnetic wave. That is, letting $\lambda$ be the electrical length when the electromagnetic wave in the desired cutoff frequency band propagates through the signal line, it is possible to obtain the satisfactory passband characteristic and cutoff characteristic by making the interval between the unit cell structures be about $\lambda/4$ of the length.

As described above, it is possible in the electronic circuit to adjust the characteristic as the EBG structure by adjusting the number and the interval of unit cell structures to be arranged.

(Cutoff Characteristic for Electromagnetic Wave Propagating between Conductor Planes)

The characteristic when arranging the unit cell structures under the signal line has been described above. However, an electronic circuit substrate generally has a layer arrangement and noise which propagates between conductor planes formed of respective layers may raise a problem in that electronic circuit substrate. Therefore, characteristics for not only the electromagnetic wave which propagates through the signal line but also the electromagnetic wave which propagates between the conductor planes will now be evaluated.

Figure 10A:
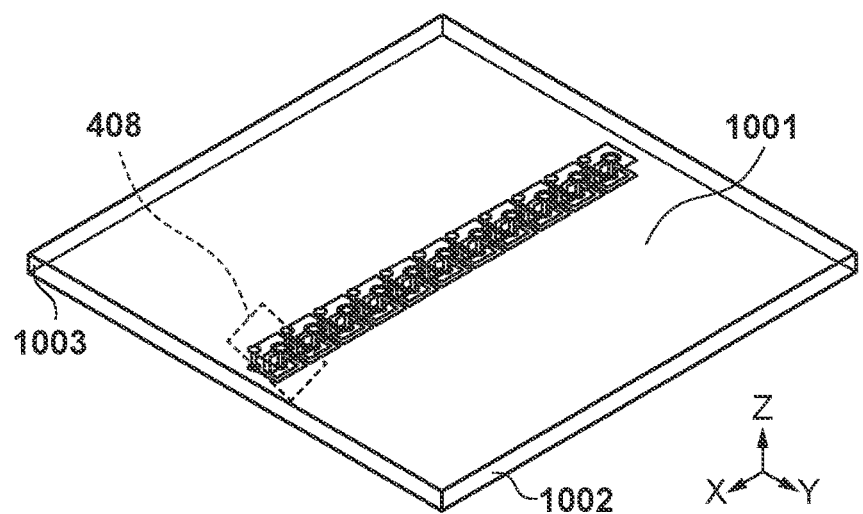
FIGS. 10A and 10B are a schematic view showing the arrangement in which a plurality of unit cell structures are arranged between plane-shaped conductors and a graph showing the transmission coefficient S21.

In this evaluation, the arrangement as shown in FIG. 10A is used. The arrangement of FIG. 10A includes a conductor plane 1001 and a ground conductor plane 1002 each having a planar shape, a dielectric 1003, and a plurality of unit cell structures 408. Note that a clearance is provided in the portion of a through hole conductor via 413 shown in FIGS. 4C and 4D in the conductor plane 1001 so as not to conduct to the unit cell structures 408. Each unit cell structure used here is designed to operate as the EBG in the 2.4-GHz band which is the frequency band used in a wireless LAN. Each unit cell structure 408 arranged between the conductor plane 1001 and the ground conductor plane 1002 has the same structure as the unit cell structure described in the first configuration example. However, the overall length of its spiral conductor needs to be adjusted. This is because coupling which occurs between the unit cell structures and the conductor plane, and coupling which occurs between the unit cell structures and the signal line are different in coupling amount.

Figure 10B:
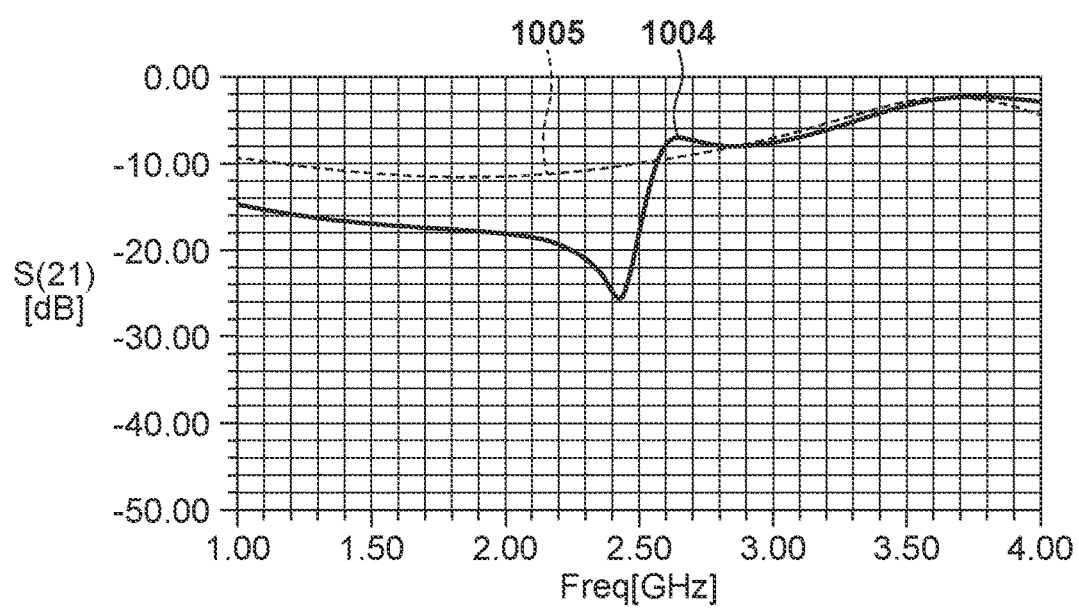

FIG. 10B shows the transmission coefficient S21 of an electromagnetic wave which propagates through the conductor plane 1001 in the Y-axis direction at this time. In FIG. 10B, curves denoted by reference numerals 1004 and 1005, respectively, indicate characteristics when the unit cell structures 408 are/are not arranged between the conductor plane 1001 and the ground conductor plane 1002. As seen in FIG. 10B, the electromagnetic wave in the desired frequency band can be cut off by arranging the unit cell structures 408 between the conductor plane 1001 and the ground conductor plane 1002.

As shown in FIG. 10A, a case in which the single-line EBG structure is arranged in the Y-axis direction has been described here. It is possible, however, to increase the attenuation amount by increasing the number of lines of the unit cell structures as shown in FIGS. 9A and 9B. It is also possible, at this time, to obtain the desired passband characteristic and cutoff characteristic by adjusting the interval of the lines of the unit cell structures to about λ/4. A case in which the unit cell structures 408 shown in FIGS. 4C and 4D are arranged between conductor planes has been described here. However, the electromagnetic wave in the desired frequency band can also be cut off by arranging a unit cell structure 701 shown in FIGS. 7A and 7B.

THIRD CONFIGURATION EXAMPLE

A unit cell structure of this configuration example will be described with reference to FIGS. 11A and 11B. FIG. 11A shows the arrangement of the unit cell structure, and FIG. 11B shows a sectional view when viewed from the Y-Z plane of the structure in FIG. 11A. As shown in FIG. 11A, a unit cell structure 1101 according to this configuration example forms a plurality of pattern conductors of two layers and forms a helical shape by connecting the pattern conductors of the two layers alternately and in series by using vias. The unit cell structure 1101 includes a ground conductor 1102, conductors 1103 to 1107, conductor vias 1108 to 1112, and a dielectric 1113. More specifically, in the unit cell structure 1101, ones of the respective ends of the two different conductors out of the conductors formed of the first layer are connected to the two different ends of the one conductor out of the conductors formed of the second layer. For example, ones of the respective ends of the conductors 1103 and 1104 formed of the first layer are connected to the different ends of the conductor 1106 formed of the second layer by the conductor vias 1111 and 1109. By doing so, in the unit cell structure 1101, the conductor via 1108, the conductor 1103, the conductor via 1111, the conductor 1106, the conductor via 1109, the conductor 1104, the conductor via 1112, the conductor 1107, the conductor via 1110, and the conductor 1105 are sequentially connected in series. Note that the conductors 1103 and 1104, and 1106 and 1107 are connected to the conductor vias in their both ends, while one end of the conductor 1105 is connected to the conductor via but the other end is an open end. In FIG. 11A, each of the conductors 1103 to 1107 has a plate-like shape with a wide width. However, the present invention is not limited to this. Each of the conductors 1103 to 1107 may have a linear shape (or a plate-like shape with a narrow width).

This makes it possible to mount a conductor whose one end is connected to a ground conductor and the other end is an open end with a small area while ensuring a line length. If the unit cell structure of FIGS. 11A and 11B is designed to operate as an EBG in 2.4 GHz of a wireless LAN frequency band, its mounting area can be 1.5 mm×1.7 mm. As in each configuration example described above, a general FR-4 substrate having a 4-layer structure is used.

FIG. 11C is a view showing the analysis result of a transmission coefficient S21 of an electromagnetic wave which propagates through a signal line in the Y-axis direction when arranging the unit cell structure of FIGS. 11A and 11B under the signal line as in FIGS. 5A and 5B. Note that a signal line width, a ground conductor width, and a substrate thickness are the same as the values that have been described with reference to FIGS. 5A and 5B. As seen in FIG. 11C, also in the unit cell structure of FIGS. 11A and 11B, the electromagnetic wave which propagates through the signal line has the transmission coefficient S21 of about −15 dB in the 2.4-GHz band and is attenuated sufficiently.

Note that also in the unit cell structure of FIGS. 11A and 11B, it is possible to increase coupling by adjusting the positional relationship between the open end and the signal line, and achieve further miniaturization. In the unit cell structure of FIGS. 11A and 11B, it is also possible, by moving the open end closer to the ground conductor, to implement further miniaturization even though the attenuation amount of the electromagnetic wave is not large. Furthermore, in the unit cell structure of FIGS. 11A and 11B, further miniaturization can be achieved by rotating the conductors in the same direction rather than in the opposite direction. It is also possible to increase the attenuation amount by placing a plurality of unit cell structures side by side and, by adjusting each interval of the unit cell structures at this time to about λ/4, to obtain a satisfactory bandpass characteristic and cutoff characteristic. It is possible, by the unit cell structure of FIGS. 11A and 11B, to cut off the electromagnetic wave in a desired frequency band also between the conductor planes.

In the arrangement of FIGS. 11A and 11B, the conductors 1103 to 1107 are all arranged between the layer where the ground conductor 1102 is formed and the layer where the signal line is formed. However, the present invention is not limited to this. For example, the conductors 1106 and 1107 may be formed of the same layer as the layer where the ground conductor 1102 is formed. As a result, for example, the conductor vias 1108 to 1112 become longer, and thus longer line lengths can be ensured. In the example of FIGS. 11A and 11B, the conductor 1103 formed of the layer closer to the layer where the signal line is formed is connected to the ground conductor 1102. However, the present invention is not limited to this. That is, any conductor of the layer where the conductor 1106 is formed may be connected to the ground conductor 1102. Note that in the example of FIGS. 11A and 11B, for example, when the conductor 1106 is connected to the ground conductor 1102 and the conductor 1103 is not connected to the ground conductor 1102, the unit cell structure can function as a dual-band EBG to be described later.

Note that an arrangement obtained by combining the third configuration example and the first or second configuration example may be used. For example, two or more curve linear conductors of the first layer are arranged, and one or more curve linear conductor of the second layer is arranged. Then, one linear conductor where the plurality of conductors are connected in series is formed by connecting ones of the respective ends of the two different conductors out of the linear conductors of the first layer to the two different ends of the one linear conductor of the second layer by the conductor vias or the like. This makes it possible to ensure the line length of each conductor according to an EBG structure while suppressing the mounting area.

FOURTH CONFIGURATION EXAMPLE

In each configuration example described above, the EBG structure configured to arrange, between the signal line and the ground conductor arranged in parallel, the conductor whose one end is connected to the ground conductor and the other end is the open end has been described. In this configuration example, an EBG structure configured to arrange, between a signal line and a ground conductor arranged in parallel, a conductor whose both ends are open ends will be described.

Figure 12:
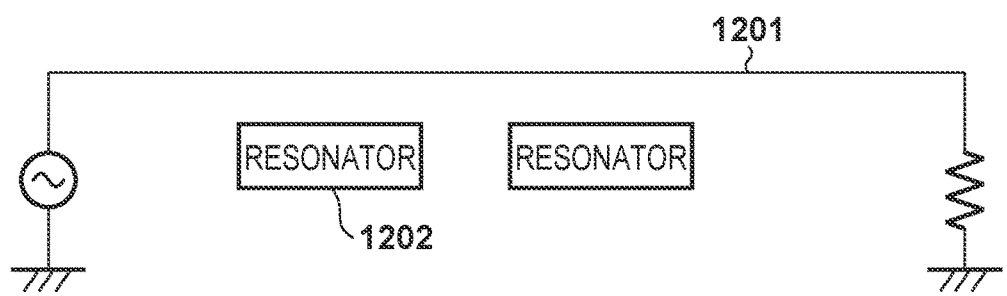
FIG. 12 is a view showing the outline of the arrangement of an EBG structure according to the fourth configuration example.

First, the operation principle of the EBG structure in this configuration example will be described. FIG. 12 shows the outline of the arrangement of the EBG structure according to this configuration example. The EBG structure according to this configuration example includes a signal line 1201 and resonators 1202. With this arrangement, it is possible to cut off an electromagnetic wave at a desired frequency which propagates through the signal line by arranging the resonators each resonating with the desired frequency under the signal line to electromagnetically couple with the signal line. It is known that the conductor whose both ends are the open ends resonates if a conductor length is λ/2 when letting λ be an electrical length. In this configuration example, the size of the entire EBG structure is reduced while making the line length of the conductor whose both ends are the open ends be a length capable of cutting off the electromagnetic wave with the desired frequency.

Figure 13A:
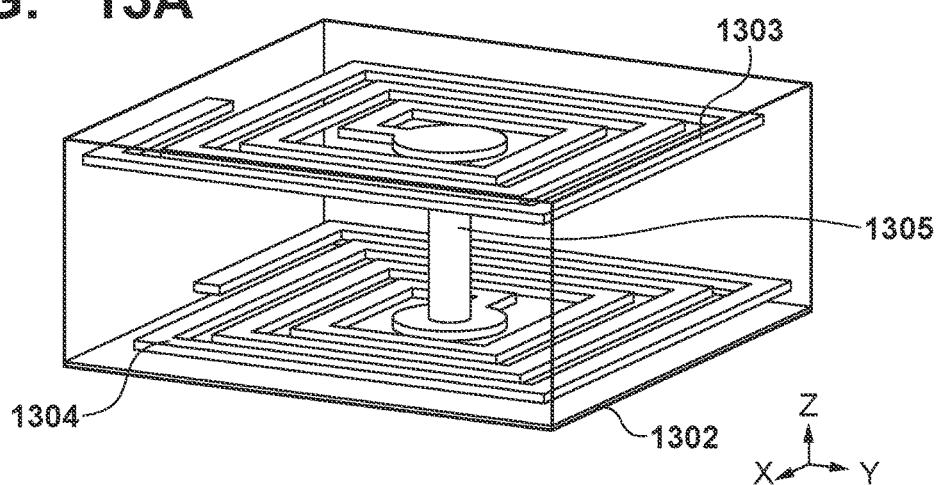
FIGS. 13A to 13C are a schematic view and a sectional view showing a unit cell structure according to the fourth configuration example, and a graph showing a transmission coefficient S21.
Figure 13B:
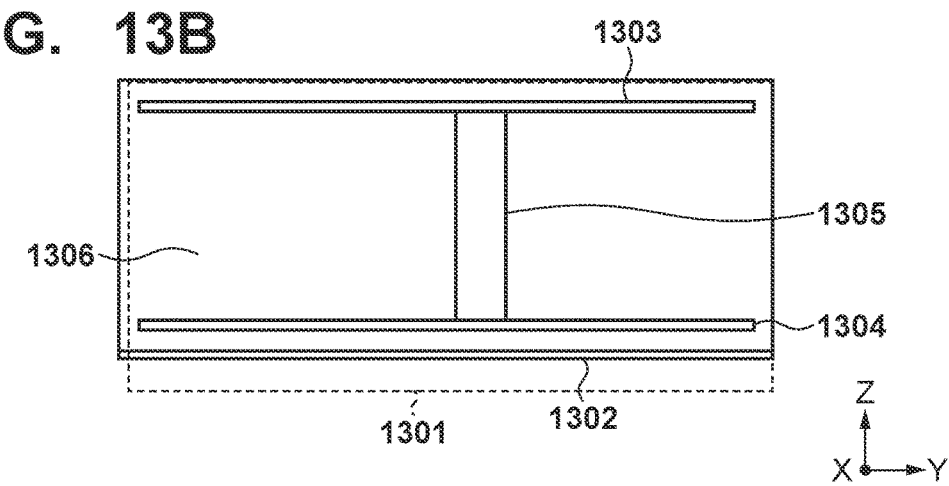

FIGS. 13A and 13B are views showing the unit cell structure of the EBG structure according to this configuration example. FIG. 13A is a schematic view in which a unit cell having the EBG structure is formed on a 4-layer printed substrate. FIG. 13B is a sectional view when viewed from the Y-Z plane of the unit cell structure in FIG. 13A. A unit cell structure 1301 includes a ground conductor 1302, spiral conductors 1303 and 1304, and a conductor via 1305. Further, the unit cell structure 1301 is formed in a dielectric 1306.

The first spiral conductor 1303 is connected to the second spiral conductor 1304 by the conductor via 1305. As described above, it becomes possible to form a conductor having a long line length in a small volume by arranging the spiral conductors of a plurality of layers and connecting the ends of the respective spiral conductors by the via, and reduce the size of the EBG structure. For example, if the unit cell structure of FIGS. 13A and 13B is designed to operate as an EBG in 2.4 GHz of a wireless LAN frequency band, its size (its area on the substrate) can be 1.9 mm×1.9 mm. Note that as in each configuration example described above, a general FR-4 substrate having a 4-layer structure is used.

As compared with a unit cell structure 401 in FIGS. 4C and 4D, the both ends of the unit cell structure 1301 in FIGS. 13A and 13B are the open ends, and thus a conductor via 406 need not be arranged and only a via on a core layer suffices as the conductor via. This makes it possible to reduce a manufacturing cost. Furthermore, in a unit cell structure 408 using a through hole via shown in FIGS. 4C and 4D, the mounting areas of the top layer portion and the bottom layer portion of the substrate are reduced by a conductor via 413 or the via land of the conductor via 413. However, there is no such restriction in the unit cell structure 1301 whose both ends are the open ends. Therefore, the mounting area of a circuit component on the substrate becomes larger than in the structure of FIGS. 4C and 4D.

Figure 13C:
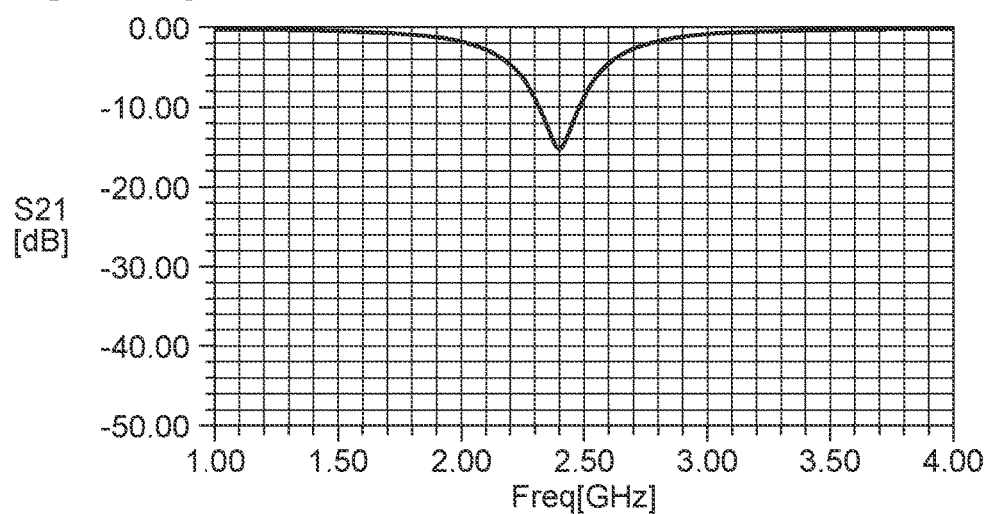

FIG. 13C shows the analysis result of a transmission coefficient S21 of the electromagnetic wave which propagates through the signal line in the Y-axis direction when arranging the unit cell structure of FIGS. 13A and 13B under the signal line as shown in FIGS. 5A and 5B. Note that a signal line width, a ground conductor width, and a substrate thickness are the same as those used in the description according to FIGS. 5A and 5B. As seen in FIG. 13C, also in the unit cell structure of FIGS. 13A and 13B, the electromagnetic wave which propagates through the signal line is attenuated sufficiently with the transmission coefficient S21 of about −15 dB in the 2.4-GHz band.

Note that also in the unit cell structure of FIGS. 13A and 13B, it is possible to achieve further miniaturization by making the respective rotation directions of the conductor 1303 and the conductor 1304 equal to each other in a direction from the open end of the conductor 1304 to the open end of the conductor 1303. In the structure of FIGS. 13A and 13B, for example, the rotation direction is the same between when rotating from the open end of the conductor 1304 to the conductor via 1305 and when rotating from the conductor via 1305 to the open end of the conductor 1303. It is therefore possible to achieve further miniaturization as compared with a case in which these two conductors do not point in the same rotation direction. Furthermore, in the structure of FIGS. 13A and 13B, the attenuation amount can be increased by arranging a plurality of unit cell structures side by side. At this time, it is also possible to obtain a satisfactory bandpass characteristic and cutoff characteristic by making the arrangement interval of the unit cell structures be about ¼ length of the electrical length λ when the electromagnetic wave in a desired cutoff frequency band propagates through the signal line. Furthermore, in the structure of FIGS. 13A and 13B, the electromagnetic wave in the desired frequency band can be cut off also between conductor planes.

In this configuration example, the spiral conductors of the two layers on the substrate are formed. However, further miniaturization is possible by using more layers and ensuring a line length on the above-described principle. For example, spiral conductors of three different layers are formed, the center portions of the spiral shapes of the two conductors of the top layer and the second layer are connected to each other by a conductor via, and the ends of the outermost portions of the two spiral shapes of the second and third layers are connected to each other by a conductor via. At this time, the rotation directions from the end of the outermost portion of the spiral conductor of the top layer to the center portion of the bottom layer (third layer) can be matched. In the above-described example, the open ends exist in the outermost portion of the top layer and the center of the bottom layer. However, this may be opposite. That is, the open ends may exist in the center portion of the top layer and the outermost portion of the bottom layer. As in the above-described example, it is also possible to form curved conductors of four or more layers. Furthermore, the shape of each conductor may not be spiral, but a curved shape such as a meander shape which ensures the line length of the conductors may be formed of a plurality of layers and be connected.

Note that in each configuration example described above, it is also possible, when connecting to the ground conductor, to ensure a line length with a sufficient length in a small installation area by similarly arranging curved conductors of a plurality of layers greater than two. That is, it is possible to ensure a conductor length while suppressing the area by connecting the conductor of the bottom layer or the top layer to the ground conductor and, as described above, forming and connecting the curved conductors of the plurality of layers greater than two.

Figure 14A:
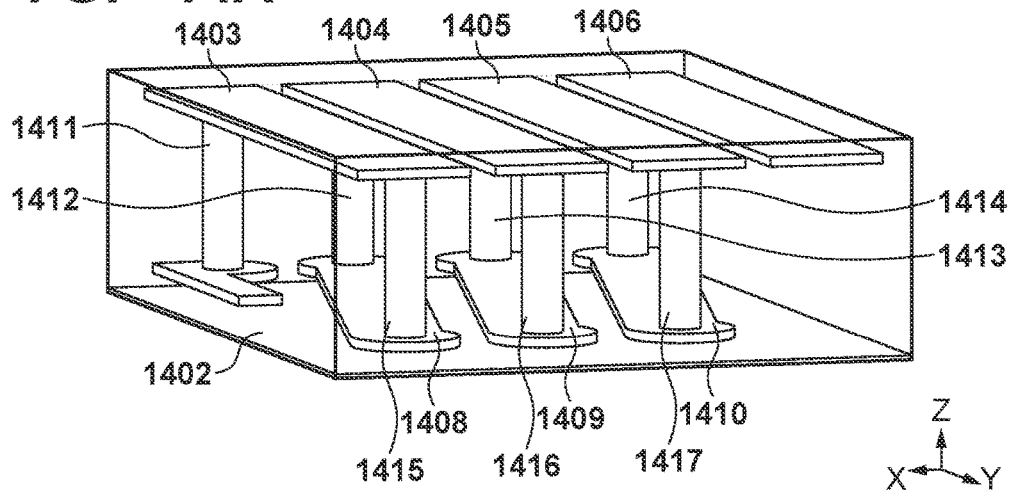
FIGS. 14A to 14C are a schematic view and a sectional view showing another unit cell structure according to the fourth configuration example, and a graph showing the transmission coefficient S21.
Figure 14B:
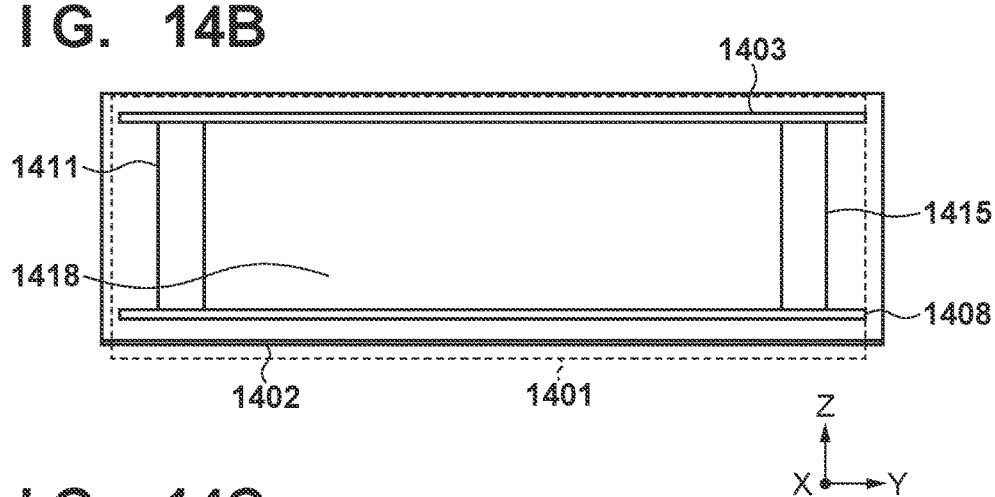

In this configuration example, as in FIGS. 14A and 14B, an arrangement in which the both ends of a helical conductor formed by connecting conductors of a plurality of layers alternately and in series are open ends may be used in the arrangement that has been described with reference to FIGS. 11A and 11B. FIG. 14A is a view showing the arrangement of such a unit cell structure. FIG. 14B is a sectional view when viewed from the Y-Z plane of the arrangement in FIG. 14A. In FIGS. 14A and 14B, a plurality of pattern conductors of two layers are formed and a helical shape is formed by connecting these pattern conductors by using vias. A unit cell structure 1401 includes a ground conductor 1402, conductors 1403 to 1410, conductor vias 1411 to 1417, and a dielectric 1418.

More specifically, in the unit cell structure 1401, the conductors 1403 to 1406 are formed of the first layer and the conductors 1407 to 1410 are formed of the second layer in the substrate. Ones of the respective ends of the two different conductors out of the conductors formed of the first layer are connected to the two different ends of the one conductor out of the conductors formed of the second layer. For example, the ones of the respective ends of the conductors 1403 and 1404 formed of the first layer are connected to the different ends of the conductor 1408 formed of the second layer by the conductor vias 1415 and 1412. Note that the conductor 1406 out of the conductors formed of the first layer and the conductor 1407 out of the conductors formed of the second layer are configured such that their one ends are open ends and are not connected to other conductors. By doing so, in the unit cell structure 1401, the plurality of conductors are connected in series in the order of the conductor 1407, the conductor 1403, the conductor 1408, the conductor 1404, the conductor 1409, the conductor 1405, the conductor 1410, and the conductor 1406, thereby forming one (linear) conductor. The conductor vias 1411 to 1417, respectively, are used to connect these conductors as shown in FIGS. 14A and 14B.

This makes it possible to mount a conductor whose one end is connected to a ground conductor and the other end is an open end with a small area while ensuring a line length. If the unit cell structure of FIGS. 14A and 14B is designed to operate as an EBG in 2.4 GHz of a wireless LAN frequency band, its size (its area on the substrate) can be 2.2 mm×2.5 mm. Note that as in each configuration example described above, a general FR-4 substrate having a 4-layer structure is used.

As in the example of FIGS. 13A and 13B, the unit cell structure can be formed, also in the structure of FIGS. 14A and 14B, by only using an inner layer via of the core layer as the conductor via. This makes it possible to reduce the manufacturing cost. Furthermore, as compared with the unit cell structure using the through hole via shown in FIGS. 11A and 11B, the mounting area of the circuit component on the substrate is not reduced in the structure in which the both ends are the open ends.

Figure 14C:
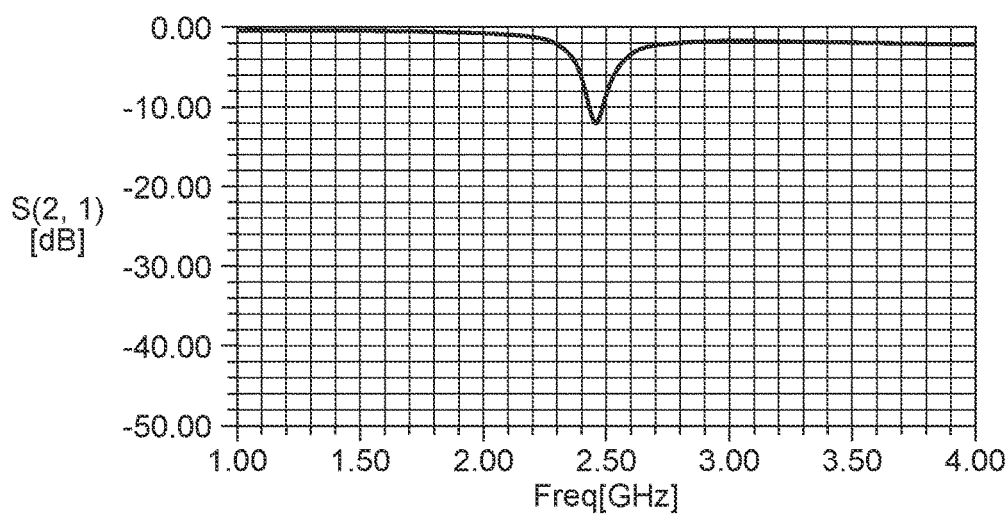

FIG. 14C shows the analysis result of the transmission coefficient S21 of the electromagnetic wave which propagates through the signal line in the Y-axis direction when arranging the unit cell structure of FIGS. 14A and 14B under the signal line as shown in FIGS. 5A and 5B. Note that the signal line width, the ground conductor width, and the substrate thickness are the same as those used in the description according to FIGS. 5A and 5B. As seen in FIG. 14C, also in the unit cell structure of FIGS. 14A and 14B, the electromagnetic wave which propagates through the signal line is attenuated sufficiently with the transmission coefficient S21 of about −10 dB in the 2.4-GHz band.

Note that also in the unit cell structure of FIGS. 14A and 14B, it is possible to achieve further miniaturization by making the rotation directions of the respective conductors equal to each other in a direction from the open end of the conductor 1407 to the open end of the conductor 1406. In the structure of FIGS. 14A and 14B, the attenuation amount can be increased by arranging a plurality of unit cell structures side by side. At this time, it is also possible to obtain the satisfactory bandpass characteristic and cutoff characteristic by making the arrangement interval of the unit cell structures be about ¼ length of the electrical length λ when the electromagnetic wave in the desired cutoff frequency band propagates through the signal line. Furthermore, in the structure of FIGS. 14A and 14B, the electromagnetic wave in the desired frequency band can be cut off also between the conductor planes.

Note that in the arrangement of FIGS. 14A and 14B, at least any of the above-described conductors 1403 to 1410 may have the curved shape such as the spiral shape or the meander shape in order to increase the line length.

(Characteristic Change by Electromagnetic Coupling between Unit Cell Structure and Signal Line or Ground Conductor)

A change in the transmission coefficient S21 by electromagnetic coupling between the signal line or the ground conductor and the unit cell structure in FIGS. 13A and 13B or FIGS. 14A and 14B will now be described.

Figure 15A:
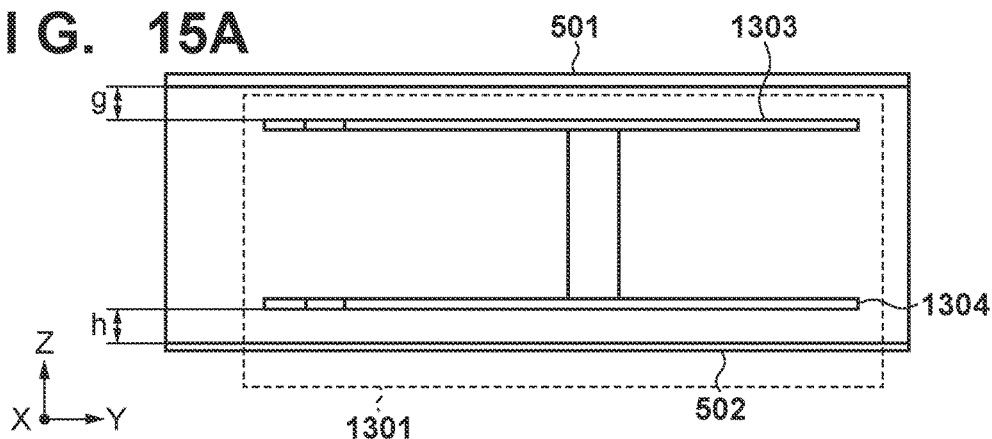
FIGS. 15A to 15C are an enlarged sectional view showing the positional relationship between a signal line and a ground conductor, and the unit cell structure of FIGS. 13A and 13B, and graphs each showing the transmission coefficient S21.

First, the propagation cutoff characteristic of the electromagnetic wave when changing the distance between the unit cell structure 1301 in FIGS. 13A and 13B, and the signal line and the ground conductor in the arrangement of FIGS. 5A and 5B will be described. FIG. 15A shows the positional relationship between the unit cell structure 1301, and a signal line 501 and a ground conductor 502 when FIGS. 5A and 5B are viewed from the X-axis direction. Note that FIG. 15A shows the enlarged unit cell structure 1301 in order to understand the relationship between the unit cell structure 1301, and the signal line 501 and the ground conductor 502. As shown in FIG. 15A, let g be a distance between the signal line 501 and the spiral conductor 1303 of the unit cell structure 1301 in the Z-axis direction, and h be a distance between the spiral conductor 1304 and the ground conductor 502 in the Z-axis direction.

Figure 15B:
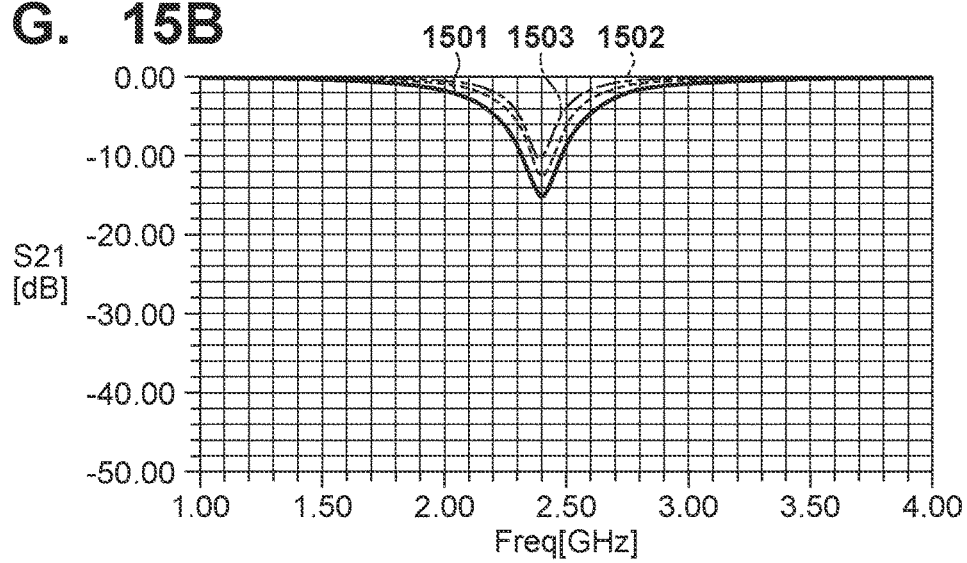

FIG. 15B shows the analysis result of the transmission coefficient S21 of the electromagnetic wave which propagates through the signal line 501 in the Y-axis direction when the distance h is fixed and the distance g is changed to 0.06 mm, 0.11 mm, and 0.16 mm. Curves denoted by reference numerals 1501 to 1503, respectively, indicate the analysis results when the distances g are 0.06 mm, 0.11 mm, and 0.16 mm. As seen in FIG. 15B, the smaller the distance g between the signal line 501 and the spiral conductor 1303 of the unit cell structure 1301 is, the larger the attenuation amount of the electromagnetic wave is. It is considered that electromagnetic coupling which occurs between the signal line 501 and the spiral conductor 1303 of the unit cell structure 1301 is related to this. That is, as electromagnetic coupling which occurs between the signal line 501 and the spiral conductor 1303 of the unit cell structure 1301 is stronger, the larger attenuation amount of the electromagnetic wave can be obtained. In general, electromagnetic coupling between two conductors becomes stronger as the distance between the two conductors is shorter. That is, since electromagnetic coupling which occurs between the conductor 1303 and the signal line 501 becomes stronger as the distance g between the conductor 1303 and the signal line 501 is shorter, the attenuation amount of the electromagnetic wave also increases. Note that since the distance g in FIG. 15A is changed by changing the position of the spiral conductor 1303 in the Z-axis direction without changing the position of the spiral conductor 1304, the length of the conductor via changes in accordance with the length of the distance g.

Figure 15C:
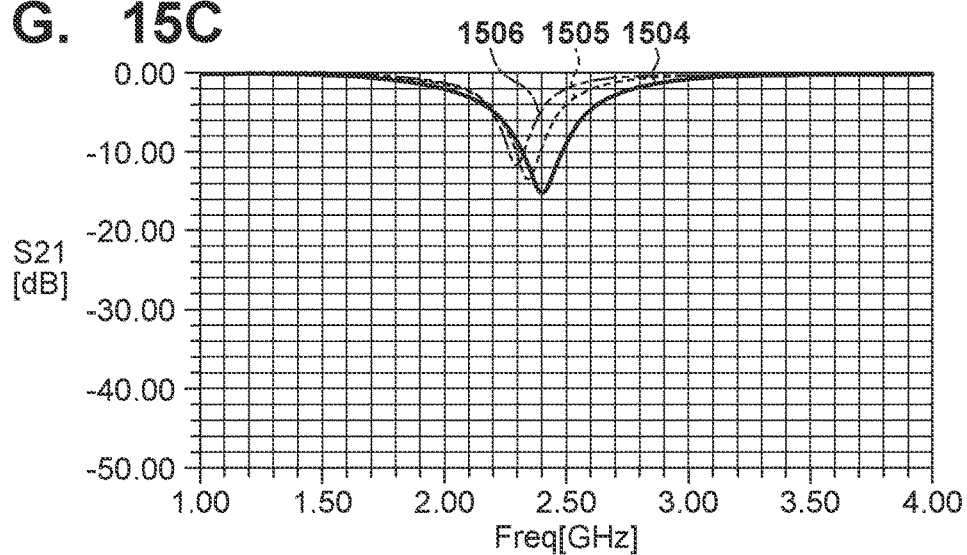

Next, FIG. 15C shows the analysis result of the transmission coefficient S21 of the electromagnetic wave which propagates through the signal line 501 in the Y-axis direction when the distance g is fixed and the distance h is changed to 0.06 mm, 0.11 mm, and 0.16 mm. Curves denoted by reference numerals 1504 to 1506, respectively, indicate the analysis results when the distances h are 0.06 mm, 0.11 mm, and 0.16 mm. As seen in FIG. 15C, the smaller the distance h between the ground conductor 502 and the spiral conductor 1304 of the unit cell structure 1301 is, the larger the attenuation amount of the electromagnetic wave is. It is considered that electromagnetic coupling which occurs between the ground conductor 502 and the spiral conductor 1304 of the unit cell structure 1301 is related to this. That is, as electromagnetic coupling which occurs between the ground conductor 502 and the spiral conductor 1304 of the unit cell structure 1301 is stronger, the larger attenuation amount of the electromagnetic wave can be obtained. That is, since electromagnetic coupling which occurs between the conductor 1304 and the ground conductor 502 becomes stronger as the distance h between the conductor 1304 and the ground conductor 502 is shorter, the attenuation amount of the electromagnetic wave also increases. Note that since the distance h in FIG. 15A is changed by changing the position of the spiral conductor 1304 in the Z-axis direction without changing the position of the spiral conductor 1303 as in a case in which the length of the distance g in FIG. 15A is changed, the length of the conductor via changes in accordance with the length of the distance h.

Figure 16A:
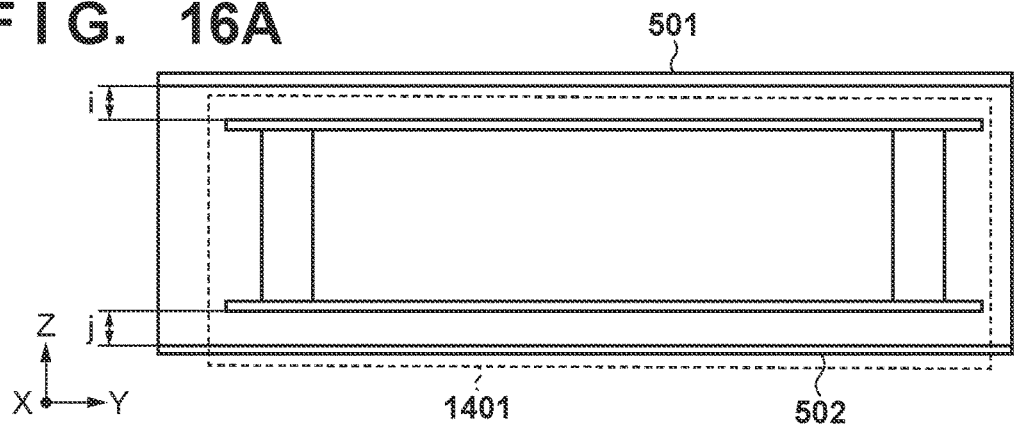
FIGS. 16A to 16C are an enlarged sectional view showing the positional relationship between the signal line and the ground conductor, and the unit cell structure of FIGS. 14A and 14B, and graphs each showing the transmission coefficient S21.

Then, the propagation cutoff characteristic of the electromagnetic wave when changing the distance between the unit cell structure 1401 in FIGS. 14A and 14B, and the signal line and the ground conductor in the arrangement of FIGS. 5A and 5B will be described. FIG. 16A shows the positional relationship between the unit cell structure 1401, and the signal line 501 and the ground conductor 502 when FIGS. 5A and 5B are viewed from the X-axis direction. Note that FIG. 16A shows the enlarged unit cell structure 1401 in order to understand the relationship between the unit cell structure 1401, and the signal line 501 and the ground conductor 502. As shown in FIG. 16A, let i be a distance between the unit cell structure 1401 and the signal line 501 in the Z-axis direction, and j be a distance between the unit cell structure 1401 and the ground conductor 502 in the Z-axis direction.

Figure 16B:
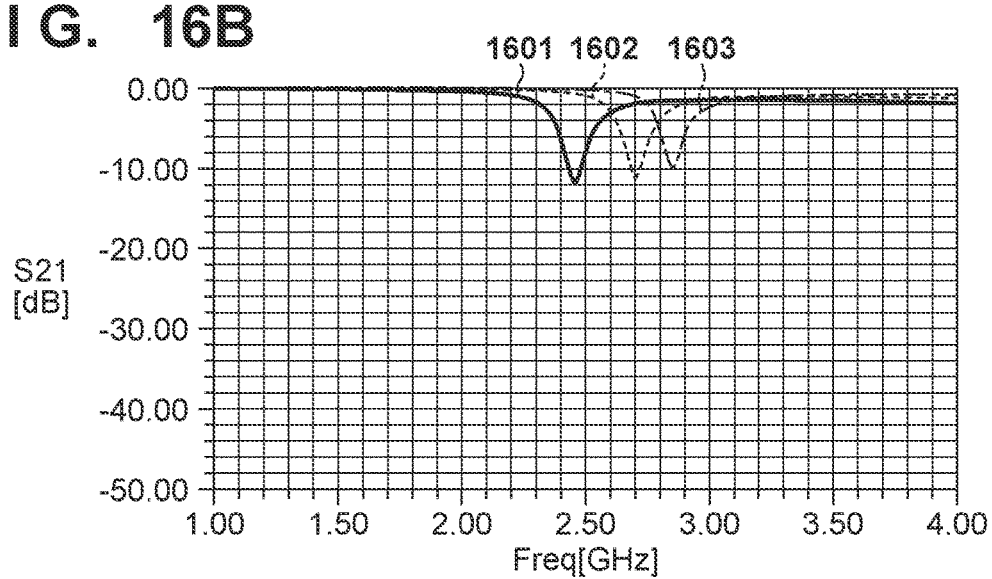

FIG. 16B shows the analysis result of the transmission coefficient S21 of the electromagnetic wave which propagates through the signal line 501 in the Y-axis direction when the distance j is fixed and the distance i is changed to 0.06 mm, 0.11 mm, and 0.16 mm. Curves denoted by reference numerals 1601 to 1603, respectively, indicate the analysis results when the distances i are 0.06 mm, 0.11 mm, and 0.16 mm. As seen in FIG. 16B, the smaller the distance i between the unit cell structure 1401 and the signal line 501 is, the larger the attenuation amount of the electromagnetic wave is. It is considered that electromagnetic coupling which occurs between the unit cell structure 1401 and the signal line 501 is related to this as in a case in which the unit cell structure 1301 is arranged under the signal line. That is, as electromagnetic coupling which occurs between the unit cell structure 1401 and the signal line 501 is stronger, the larger attenuation amount of the electromagnetic wave can be obtained.

Figure 16C:
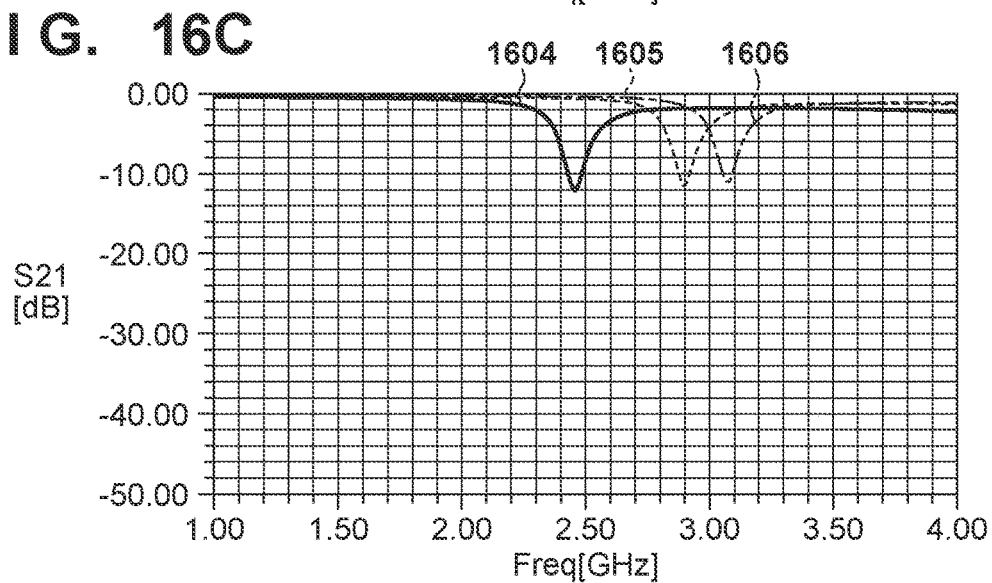

Next, FIG. 16C shows the analysis result of the transmission coefficient S21 of the electromagnetic wave which propagates through the signal line 501 in the Y-axis direction when the distance i is fixed and the distance j is changed to 0.06 mm, 0.16 mm, and 0.21 mm. Curves denoted by reference numerals 1604 to 1606, respectively, indicate the analysis results when the distances j are 0.06 mm, 0.16 mm, and 0.21 mm. As seen in FIG. 16C, the smaller the distance j between the unit cell structure 1401 and the ground conductor 502 is, the larger the attenuation amount of the electromagnetic wave is. It is considered that electromagnetic coupling which occurs between the unit cell structure 1401 and the ground conductor 502 is related to this as in the case in which the unit cell structure 1301 is arranged under the signal line. That is, as electromagnetic coupling which occurs between the unit cell structure 1401 and the ground conductor 502 is stronger, the larger attenuation amount of the electromagnetic wave can be obtained.

Note that since the distance i or j of FIG. 16A is changed by changing the position of the linear conductor in the Z-axis direction as in a case in which the length of the distance g or h of FIG. 15A is changed, the length of the conductor via changes in accordance with the length of the distance i or j. Note that in FIG. 16B or 16C, the change of a cutoff frequency to a high frequency band as the distance i or j increases is influenced by the fact that the conductor via of the unit cell structure 1401 becomes shorter. The conductor length of the unit cell structure itself also becomes shorter as the conductor via becomes shorter, thus having a resonance frequency in a higher frequency band. It is considered that the cutoff frequency changes to the high frequency band in accordance with this.

As described above, the unit cell structure 1301 or 1401 of FIGS. 13A and 13B or FIGS. 14A and 14B can increase electromagnetic coupling by decreasing the distance between itself and the signal line 501 or the ground conductor 502, and increase the attenuation amount of the electromagnetic wave.

Note that the whole conductor formed of one layer is moved in the Z-axis direction to decrease the distance between itself and the signal line or the ground conductor, and the attenuation amount of the electromagnetic wave is increased. However, the same effect can also be obtained by moving some conductors formed of the respective layers in the Z-axis direction to decrease the distance between the signal line and the ground conductor with respect to only some conductors involved.

FIFTH CONFIGURATION EXAMPLE

In each of the first to fourth configuration example described above, a single-band EBG structure that arranges the linear conductor which forms the unit cell structure between the plane where the signal line is arranged and the plane where the ground conductor is arranged which are in parallel to each other, and attenuates the electromagnetic wave in one frequency band which propagates through the signal line has been described. In this configuration example, a multiband EBG structure which attenuates an electromagnetic wave in a plurality of frequency bands which propagates through a signal line will be described by using the principle of the above-described EBG structure.

Figure 17A:
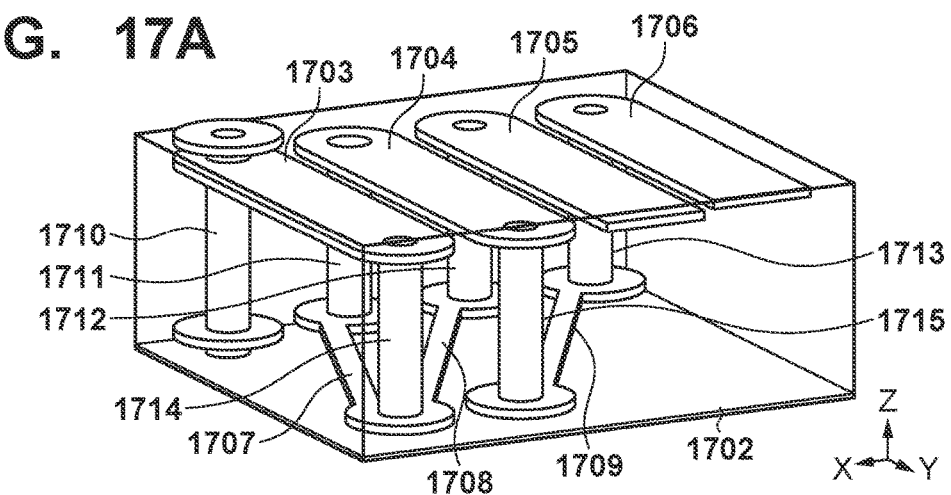
FIGS. 17A to 17C are a schematic view and a sectional view showing the unit cell structure according to the fifth configuration example, and a graph showing a transmission coefficient S21.
Figure 17B:
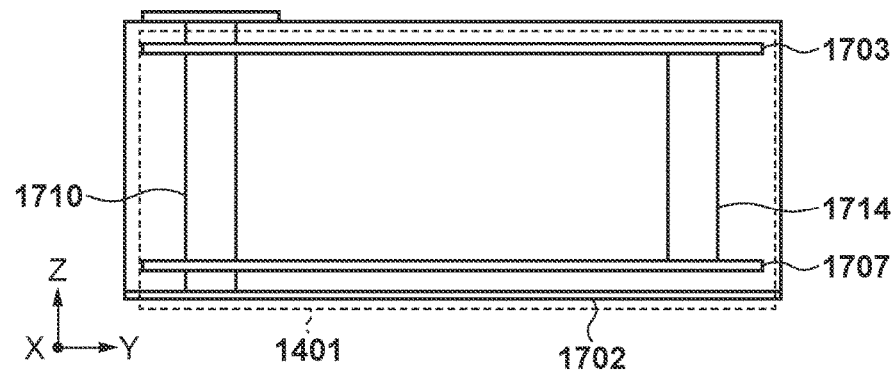

FIGS. 17A and 17B are views showing an arrangement example of a unit cell having a dual-band EBG structure according to this configuration example. In this configuration example, in a structure in which one end of a conductor is connected to ground and the other end is an open end, a helical linear conductor is formed by forming a plurality of pattern conductors of two layers and connecting the pattern conductors of the two layers alternately and in series by using a conductor via. FIG. 17A is a schematic view in which the unit cell having the dual-band EBG structure is formed on a 4-layer printed substrate. FIG. 17B is a sectional view when viewed from the Y-Z plane of the unit cell structure in FIG. 17A. A unit cell structure 1701 includes a ground conductor 1702, conductors 1703 to 1709, vias 1710 to 1715, and a dielectric 1716.

In the unit cell structure 1701, the via 1710, the conductor 1703, and the via 1714 are sequentially connected, and the conductor 1707 and the conductor 1708 branch from the via 1714. The via 1711, the conductor 1704, the via 1715, the conductor 1709, the via 1713, and the conductor 1706 are sequentially connected in series from the conductor 1707. Further, the via 1712 and the conductor 1705 are sequentially connected in series from the conductor 1708.

In this EBG structure, the via 1710, the conductor 1703, the via 1714, the conductor 1707, the via 1711, the conductor 1704, the via 1715, the conductor 1709, the via 1713, and the conductor 1706 contribute to cutting off the electromagnetic wave at the first frequency. The via 1710, the conductor 1703, the via 1714, the conductor 1708, the via 1712, and the conductor 1705 contribute to cutting off the electromagnetic wave at the second frequency. In the description below, the via 1710, the conductor 1703, and the via 1714 which contribute to cutting off the electromagnetic wave at both the first frequency and the second frequency form a common conductor. Note that the common conductor does not necessarily exist. That is, for example, the via 1710, the conductor 1703, and the via 1714 are omitted and instead, a point where the conductors 1707 and 1708 branch off may be connected to the ground conductor 1702. In this case, however, contrivance to keep respective conductor lengths long is required.

A plurality of unit cell structures need to be arranged under the signal line in order to cut off the electromagnetic wave at a plurality of frequencies by using the unit cell structure 1101 having the single-band EBG structure in FIGS. 11A and 11B. The unit cell structure in FIGS. 11A and 11B uses a conductor via 1108, and decreases the mounting area of components in a top layer portion and a bottom layer portion on a substrate by the conductor via 1108 and its via land. That is, when cutting off the electromagnetic wave at the plurality of frequencies by using the unit cell structure 1101, a plurality of through hole vias are arranged on the substrate, thereby decreasing the mounting area of the components in the top layer portion and the bottom layer portion on the substrate.

On the other hand, since the via 1710 is the common conductor, the unit cell structure 1701 in FIGS. 17A and 17B only includes one through hole via. Therefore, as compared with a case in which the plurality of unit cell structures of FIGS. 11A and 11B are arranged, the mounting area of the components in the top layer portion and the bottom layer portion on the substrate is not decreased by using the unit cell structure 1701 of FIGS. 17A and 17B. Since the unit cell structure 1701 in FIGS. 17A and 17B includes the common conductor, an occupation volume as a whole EBG can be smaller when arranging the one unit cell structure 1701 than arranging the plurality of unit cell structures 1101 of FIGS. 11A and 11B. Note that if the unit cell structure of FIGS. 17A and 17B is designed to operate as an EBG in 2.4 GHz and 5 GHz of a wireless LAN frequency band, its size (occupation area) can be 2 mm×1.85 mm. Note that as in each configuration example described above, a general FR-4 substrate having a 4-layer structure is used.

Figure 17C:
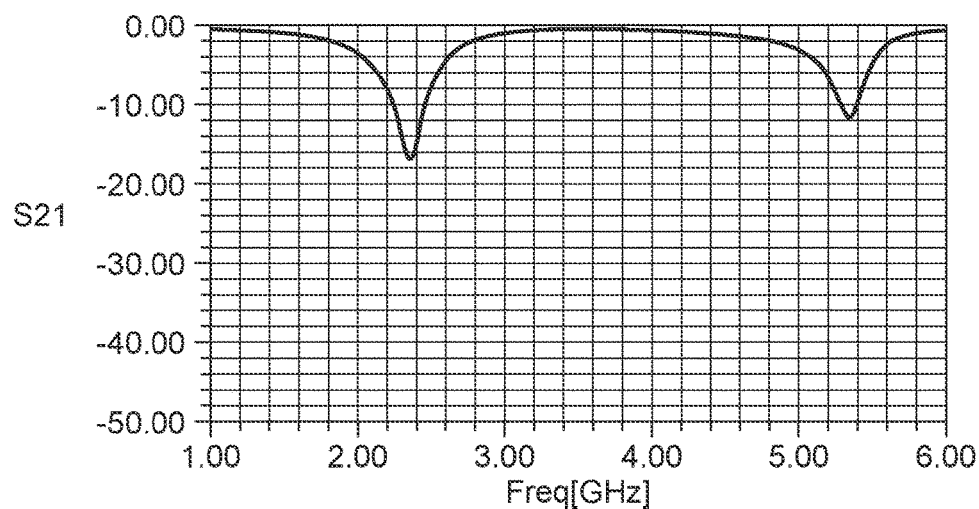

FIG. 17C shows the analysis result of a transmission coefficient S21 of the electromagnetic wave which propagates through the signal line in the Y-axis direction when arranging the unit cell structure of FIGS. 17A and 17B under the signal line as in FIGS. 5A and 5B. Note that a signal line width, a ground conductor width, and a substrate thickness are the same as the values that have been described with reference to FIGS. 5A and 5B. As seen in FIG. 17C, in the unit cell structure of FIGS. 17A and 17B, the electromagnetic wave which propagates through the signal line has the transmission coefficients S21 of about −15 dB and about −10 dB in the 2.4-GHz band and the 5-GHz band, and the electromagnetic wave at these frequencies is attenuated sufficiently.

Note that also in the unit cell structure of FIGS. 17A and 17B, further miniaturization can be achieved by rotating the conductors in the same direction rather than in the opposite direction. It is also possible to increase the attenuation amount by placing the plurality of unit cell structures side by side and, by adjusting each interval of the unit cell structures at this time to about λ/4 of a desired frequency, to obtain a satisfactory bandpass characteristic and cutoff characteristic. It is also possible, by the unit cell structure of FIGS. 17A and 17B, to cut off the electromagnetic wave in the desired frequency band also between the conductor planes.

Note that in the arrangement of FIGS. 17A and 17B, at least any of the above-described conductors 1703 to 1709 may have a curved shape such as a spiral shape or a meander shape in order to increase the line length. Furthermore, in the arrangement of FIGS. 17A and 17B, although two frequencies are set to cutoff frequencies by branching from the common conductor to two noncommon conductors, a branch to three or more noncommon conductors may be made in order to set frequencies of the number larger than two to the cutoff frequencies. Note that when the branch to the three or more noncommon conductors is made, for example, a branch from the via 1714 of FIG. 17A to the three or more conductors may be made or a branch from the via 1714 of FIG. 17A to only two conductors may be made, and then a branch to other two conductors may be made in the via 1715. That is, a branch may be made not only at the end point of the common conductor but also in a conductor which does not contribute to at least some frequencies.

Figure 18:
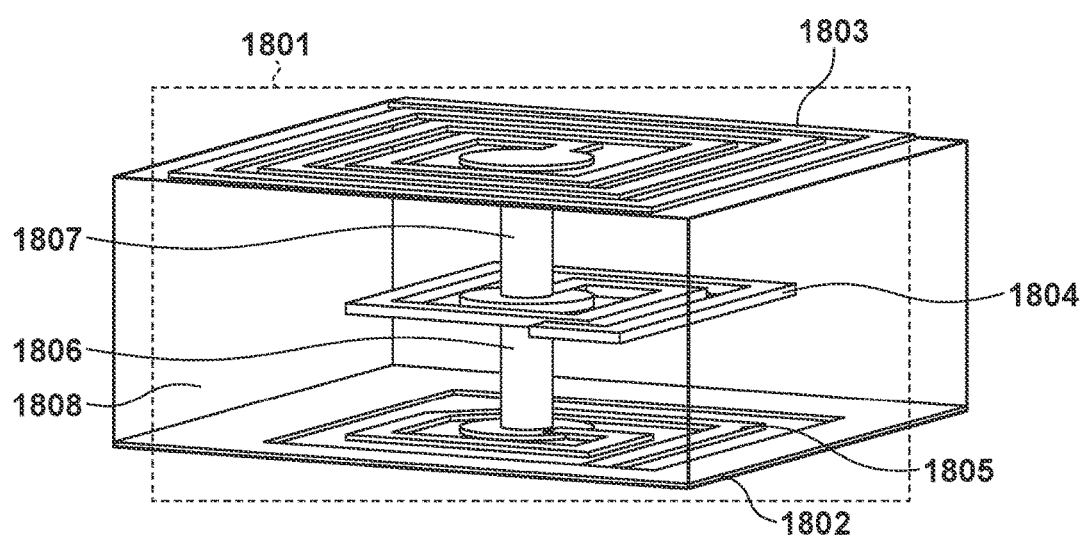
FIG. 18 is a schematic view showing another unit cell structure according to the fifth configuration example.

The helical unit cell structure 1701 of a dual-band EBG in which one end of the conductor is connected to ground and the other end is the open end has been described here. However, even a shape other than the helical shape can form the unit cell structure of the dual-band EBG. FIG. 18 shows an arrangement example of such a unit cell structure of the dual-band EBG.

A unit cell structure 1801 includes a ground conductor 1802, spiral conductors 1803 to 1805, and conductor vias 1806 and 1807. Further, the unit cell structure 1801 is formed in a dielectric 1808. The conductor via 1806 is connected to the spiral conductor 1805 connected to the ground conductor 1802, the spiral conductor 1804 and the conductor via 1807 branch from the conductor via 1806, and the conductor via 1807 is connected to the spiral conductor 1803. Note that in FIG. 18, the spiral conductor 1805 is formed of the same layer as the ground conductor 1802. However, the spiral conductor 1805 of a different layer from the ground conductor 1802 may be configured to be arranged, and connected to the ground conductor 1802 by the conductor via. Furthermore, the spiral conductor 1805 may not necessarily exist. That is, the plurality of spiral conductors 1803 and 1804 may be connected by the conductor via 1807, and the conductor via 1807 may be configured to connect to the ground conductor 1802. In this case, since the common conductor does not exist, each spiral conductor is required to have the longer conductor length.

The dual-band EBG structure of FIG. 18 contributes to cutting off the electromagnetic wave when the spiral conductor 1805, the conductor via 1806, the conductor via 1807, and the spiral conductor 1803 are at the first frequency. The dual-band EBG structure of FIG. 18 also contributes to cutting off the electromagnetic wave when the spiral conductor 1805, the conductor via 1806, and the spiral conductor 1804 are at the second frequency. In the description below, the spiral conductor 1805 and the conductor via 1806 which contribute to cutting off the electromagnetic wave at both the first frequency and the second frequency form a common conductor.

The line lengths of the conductor 1803 and the conductor 1804 can be decreased by increasing the line length of the common conductor. This makes it possible to reduce the size of the unit cell structure. In the example of FIG. 18, the conductor 1805 has the spiral shape in order to implement miniaturization of the unit cell structure while ensuring the line length of the common conductor. Similarly, the conductors 1803 and 1804 also have the spiral shapes, making it possible to keep the mounting area small. Note that the same effect can also be obtained by replacing the spiral shape of each of the conductors 1803 to 1805 with another curved shape such as a meander shape. If the unit cell structure of FIG. 18 is designed to operate as the EBG in 2.4 GHz and 5 GHz of the wireless LAN frequency band, its size can be 1.9 mm×1.9 mm. Note that the general FR-4 substrate is used at this time.

Figure 19A:
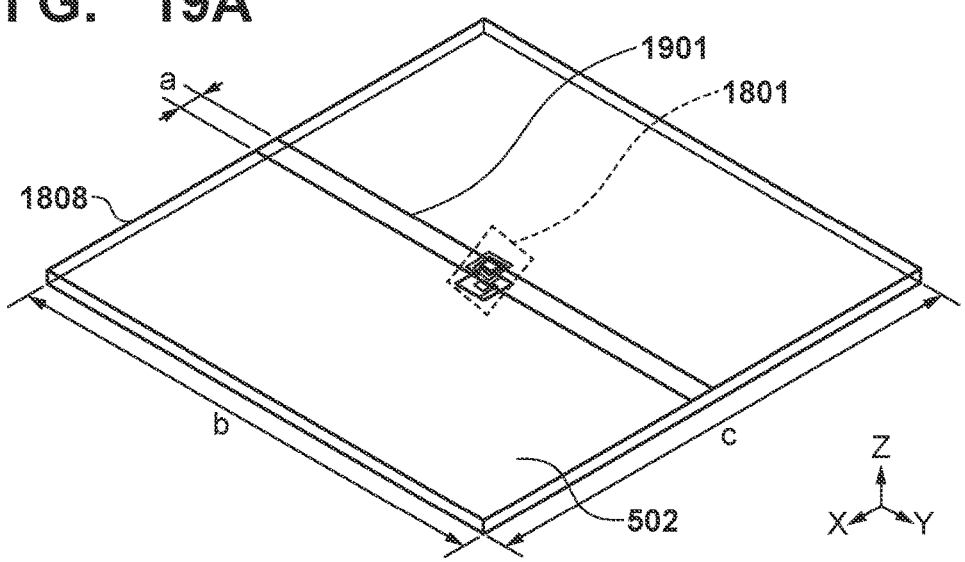
FIGS. 19A to 19C are a schematic view and a sectional view showing an electronic circuit in which the unit cell structure of FIG. 18 is arranged under a signal line, and a graph showing the transmission coefficient S21.
Figure 19B:
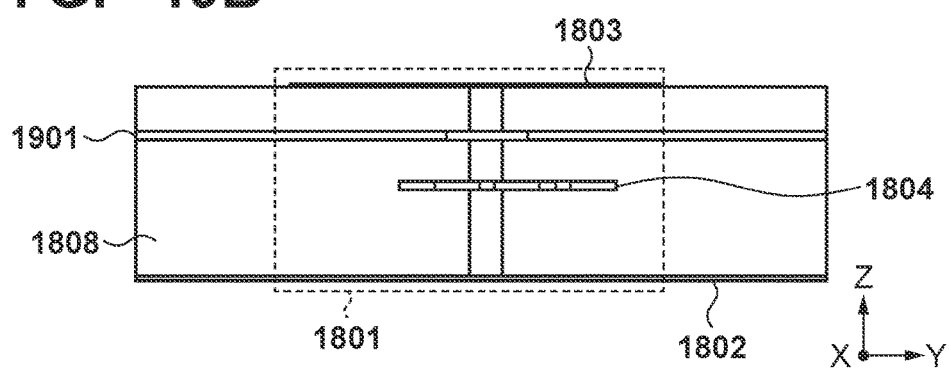

FIGS. 19A and 19B are views showing an arrangement example when the unit cell structure 1801 is used to cut off the electromagnetic wave which propagates through the signal line. FIG. 19A is a schematic view showing the arrangement of the signal line and the unit cell structure 1801. FIG. 19B is a sectional view of FIG. 19A. The unit cell structure 1801 is formed in the dielectric 1808. Note that a signal line width, a ground conductor width, and a substrate thickness are the same as the values that have been described with reference to FIGS. 5A and 5B.

In FIGS. 19A and 19B, a signal line 1901 of a layer between the spiral conductors 1803 and 1804 is arranged. This is for the purpose of increasing electromagnetic coupling between the signal line 1901, and both the spiral conductors 1803 and 1804. As described above, it is possible to increase the attenuation amount of the electromagnetic wave in the EBG structure by increasing coupling between the signal line and the unit cell structure. Note that the signal line of the layer between the conductors 1803 and 1804 does not have to be arranged, but the signal line of a layer above the conductor 1803 or the layer between the conductor 1804 and the conductor 1805 may be arranged.

Figure 19C:
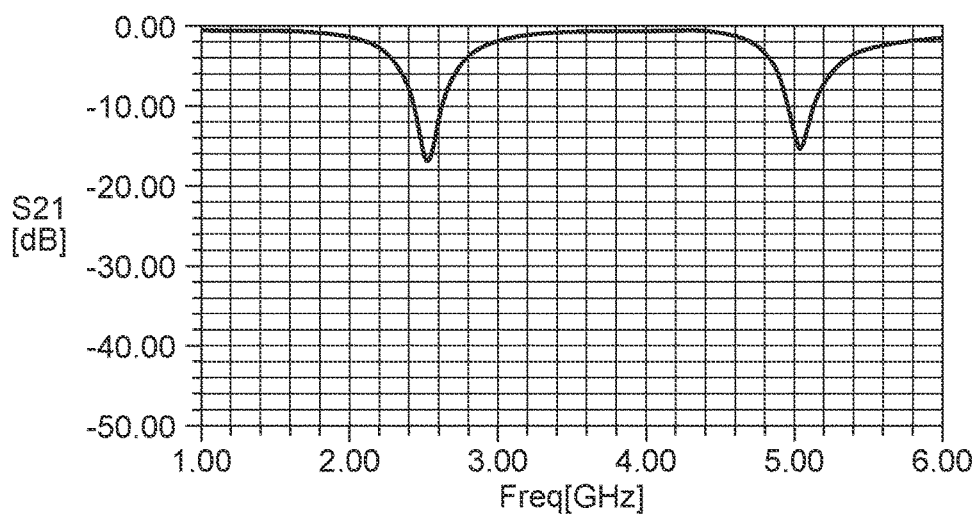

FIG. 19C shows the analysis result of the transmission coefficient S21 of an electromagnetic wave which propagates through the signal line 1901 in the Y-axis direction. As seen in FIG. 19C, in the unit cell structure of FIG. 18, the electromagnetic wave which propagates through the signal line has the transmission coefficient S21 of about −15 dB in the 2.4-GHz band and the 5-GHz band, the electromagnetic wave at these frequencies is attenuated sufficiently.

Note that also in the unit cell structure of FIG. 18, further miniaturization can be achieved by rotating the conductors in the same direction rather than in the opposite direction. It is also possible to increase the attenuation amount by placing the plurality of unit cell structures side by side and, by adjusting each interval of the unit cell structures at this time to about λ/4, to obtain the satisfactory bandpass characteristic and cutoff characteristic. It is also possible, by the unit cell structure of FIG. 18, to cut off the electromagnetic wave in the desired frequency band also between the conductor planes.

FIG. 18 shows an arrangement in which the electromagnetic wave is cut off at two frequencies by branching the conductor into two. However, the unit cell may be configured to branch the conductor into three or more and cut off the electromagnetic wave at three or more frequencies. Such a unit cell can be formed by, for example, forming the spiral conductor which branches from the conductor via 1807 at the layer between the conductors 1803 and 1804.

SIXTH CONFIGURATION EXAMPLE

In each configuration example described above, the unit cell structure of the EBG which arranges the conductor whose one end or both ends are the open ends between the plane where the signal line is arranged and the plane where the ground conductor is arranged has been described. In contrast, in this configuration example, an EBG structure in which both ends are connected to a ground conductor is arranged between the first plane where a signal line is arranged and the second plane, parallel to the first plane, where the ground conductor is arranged. Such a structure prevents propagation of an electromagnetic wave with an electrical length λ when the conductor length of the conductor is λ/2.

Figure 20A:
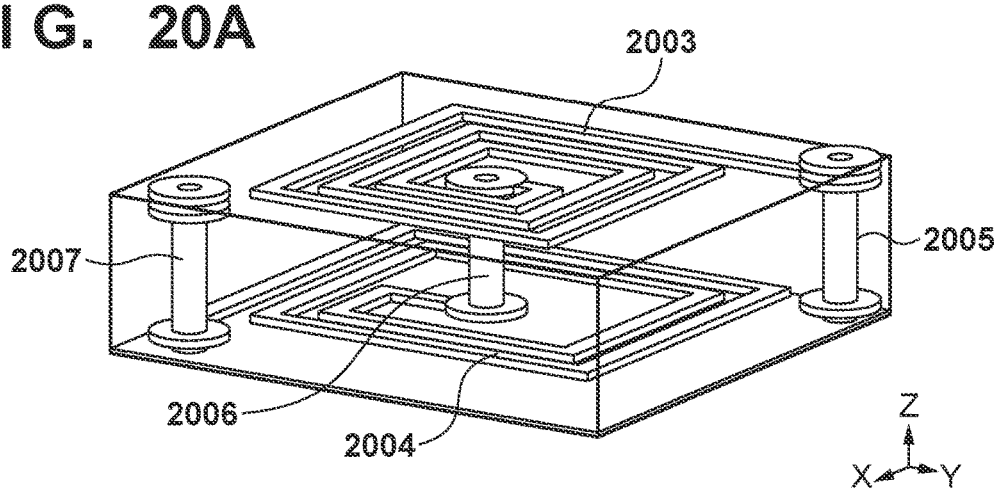
FIGS. 20A to 20C are a schematic view and a sectional view showing a unit cell structure according to the sixth configuration example, and a graph showing a transmission coefficient S21.
Figure 20B:
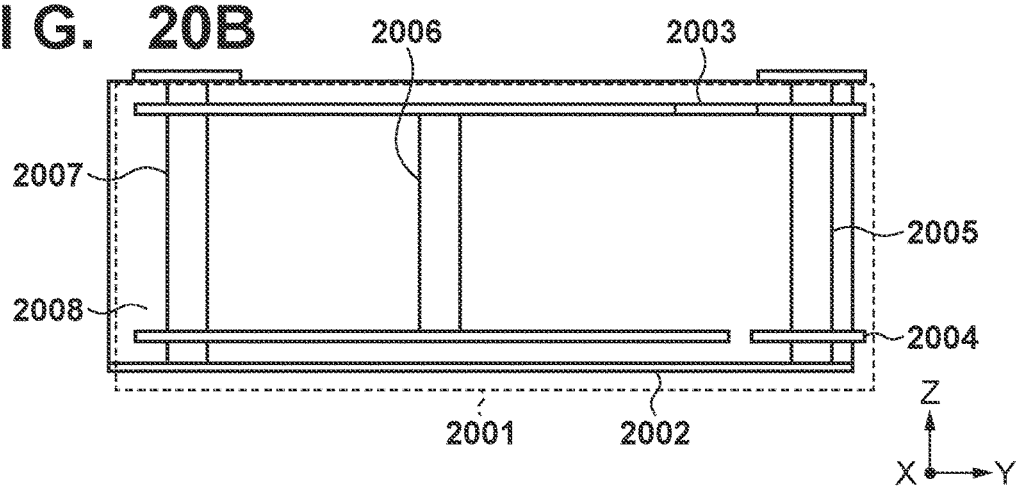

FIGS. 20A and 20B are views showing the unit cell structure having the EBG structure according to this configuration example. FIG. 20A is a schematic view in which a unit cell having the EBG structure is formed on a 4-layer printed substrate. FIG. 20B is a sectional view when viewed from the Y-Z plane of the unit cell structure in FIG. 20A. A unit cell structure 2001 includes a ground conductor 2002, spiral conductors 2003 and 2004, and conductor vias 2005 to 2007. Further, the unit cell structure 2001 is formed in a dielectric 2008. The ground conductor 2002 is connected to the spiral conductor 2003 by the conductor via 2005, the spiral conductor 2003 is connected to the spiral conductor 2004 by the conductor via 2006, and the spiral conductor 2004 is connected to the ground conductor 2002 by the conductor via 2007.

As described above, in this configuration example, a conductor which ensures a long line length in a small volume can be formed by arranging the spiral conductors of a plurality of layers and connecting the end of each spiral conductor by the conductor via. As a result, it is possible to reduce the size of the EBG structure while ensuring the line length required to cut off a predetermined frequency. For example, if the unit cell structure of FIGS. 20A and 20B is designed to operate as an EBG in 2.4 GHz of a wireless LAN frequency band, its size can be 2.6 mm×2.6 mm. Note that a general FR-4 substrate having a 4-layer structure is used at this time as in each configuration example described above.

Figure 20C:
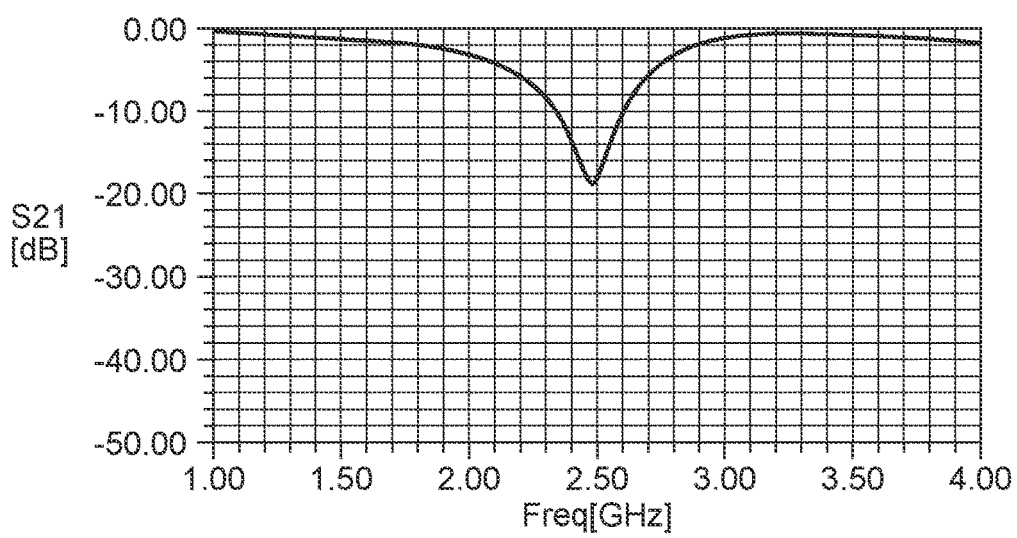

FIG. 20C shows the analysis result of a transmission coefficient S21 of the electromagnetic wave which propagates through the signal line in the Y-axis direction when arranging the unit cell structure of FIGS. 20A and 20B under the signal line as in FIGS. 5A and 5B. Note that a signal line width, a ground conductor width, and a substrate thickness are the same as the values that have been described with reference to FIGS. 5A and 5B. As seen in FIG. 20C, also in the unit cell structure of FIGS. 20A and 20B, the electromagnetic wave which propagates through the signal line has the transmission coefficient S21 of about −19 dB in the 2.4-GHz band and is attenuated sufficiently.

Figure 21A:
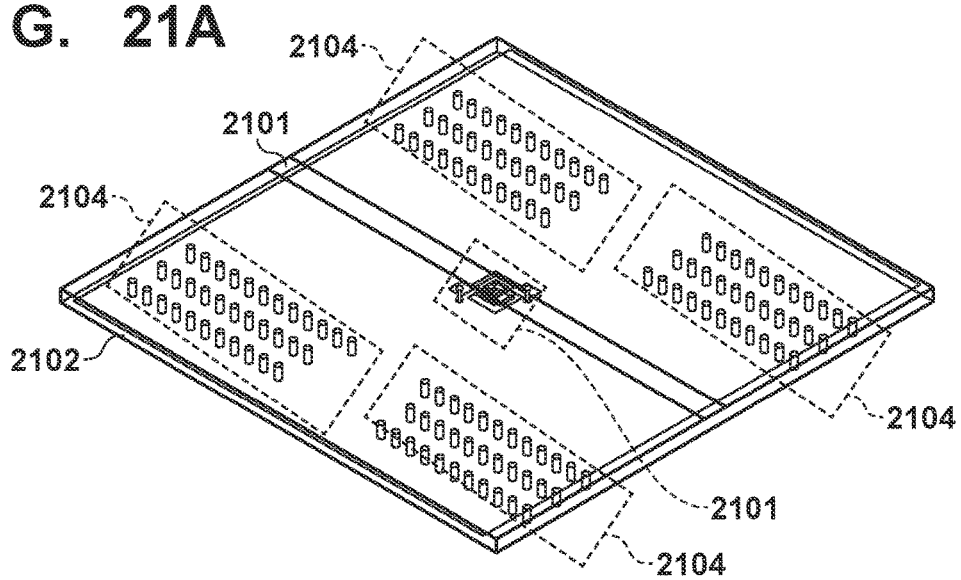
FIGS. 21A to 21C are a schematic view and an enlarged sectional view showing an electronic circuit using the unit cell structure according to the sixth configuration example, and a graph showing the transmission coefficient S21.
Figure 21B:
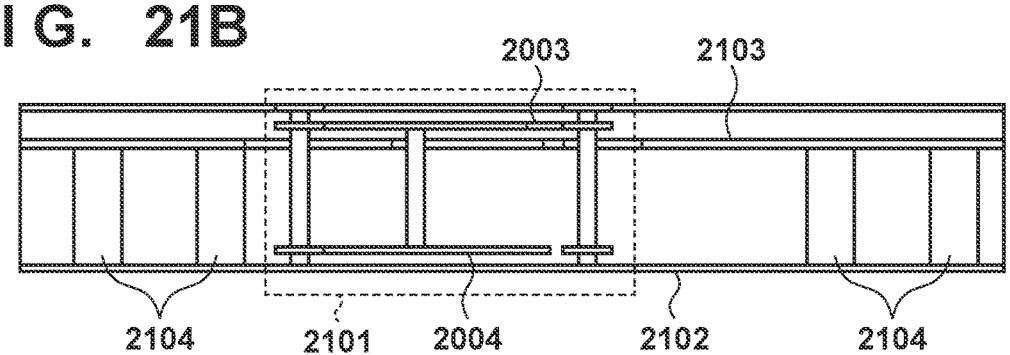

FIGS. 21A and 21B are a schematic view and an enlarged sectional view showing another EBG structure according to this configuration example. In the structure of FIG. 21A, the unit cell structure of FIGS. 20A and 20B is arranged under a signal line 2101 as in FIGS. 5A and 5B. Further, in the structure of FIG. 21A, a conductor 2103 is arranged between the second layer where the spiral conductor 2003 is arranged and the third layer where the spiral conductor 2004 is arranged, and the conductor 2103 and a ground conductor 2102 are connected by a number of conductor vias 2104. FIG. 21B is a sectional view showing the enlarged EBG structure.

A general electronic circuit substrate is formed by a plurality of layers. When designing such a substrate, ground conductors of the plurality of layers may be arranged and connected to each other by conductor vias in order to obtain a substrate with noise resistance. In this case, as in FIGS. 21A and 21B, it is considered that the ground conductor is arranged between the spiral conductors 2004 and 2005 which are a part of the EBG structure.

Figure 21C:
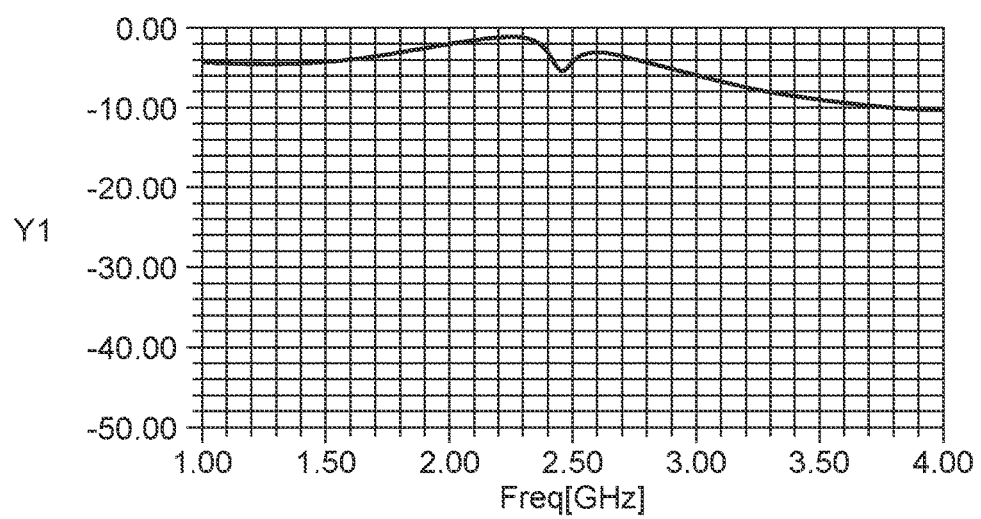

FIG. 21C shows the analysis result of the transmission coefficient S21 of an electromagnetic wave which propagates through the signal line 2101 in the Y-axis direction. Note that the signal line width, the ground conductor width, and the substrate thickness are the same as the values that have been described with reference to FIGS. 5A and 5B. As seen in FIG. 21C, in the unit cell structure of FIGS. 20A and 20B, the electromagnetic wave which propagates through the signal line has the transmission coefficient S21 of about −6 dB in the 2.4-GHz band and is attenuated sufficiently.

Comparing, between FIGS. 20C and 21C, frequencies when the transmission coefficient S21 becomes the lowest, the frequencies are 2.47 GHz in FIG. 20C and 2.45 GHz in FIG. 21C. That is, it is found that there is almost no change in a cutoff frequency even if the ground conductor is arranged between the spiral conductors 2004 and 2005. This proves that the EBG structure of FIGS. 20A and 20B is hardly influenced by the surrounding conductors arranged nearby. That is, since the cutoff frequency hardly changes even if the conductors are arranged near the EBG structure, the EBG structure of FIGS. 20A and 20B can be designed on the substrate without considering the arrangement of the surrounding conductors strictly.

Note that also in the unit cell structure shown in FIGS. 20A and 20B, it is possible to increase coupling by adjusting the positional relationship between the unit cell structure and the signal line, and achieve further miniaturization. Considering an electric field distribution at the time of primary resonance in the case of the unit cell structure in which both ends are connected to the ground conductor, an electric field concentrates the most at the middle-point position of the unit cell structure. It is therefore possible to implement miniaturization by moving the middle point of the unit cell structure closer to the signal line.

Furthermore, in the unit cell structure of FIGS. 20A and 20B, further miniaturization can be achieved by rotating the conductors in the same direction rather than in the opposite direction. It is also possible to increase the attenuation amount by placing the plurality of unit cell structures side by side and, by adjusting each interval of the unit cell structures at this time to about $\lambda/4$, to obtain a satisfactory bandpass characteristic and cutoff characteristic. It is also possible, by the unit cell structure of FIGS. 20A and 20B, to cut off the electromagnetic wave in a desired frequency band also between conductor planes.

In the above-described configuration example, propagation of the electromagnetic wave with the electrical length $\lambda$ is prevented when both ends of a linear conductor are connected to a ground portion and a conductor length is $\lambda/2$. Therefore, the same effect can also be obtained with a shape other than the shape in the practical configuration example described above. For example, in a helical structure shown in FIG. 14A, the same effect can also be obtained by connecting the both ends to the ground conductor by conductor vias.

In each configuration example described above, the EBG structure is designed to cut off the electromagnetic wave in the 2.4-GHz band (in some cases, the 5-GHz band in addition) which is the wireless LAN frequency band. However, the EBG structure can be designed in accordance with the frequency band of the electromagnetic wave that is to be cut off. That is, in each configuration example described above, a curved conductor is formed and its line length is extended by arranging the conductors of the plurality of layers except for the upper side and lower side of the substrate on which the signal line and the ground conductor are formed and connecting them by their ends. The cutoff frequency is determined in accordance with this line length. It is therefore possible to obtain a desired cutoff frequency by, in accordance with the cutoff frequency, extending the line length as in each configuration example described above, decreasing the length of each conductor, for example, in each configuration example described above, or adjusting the length of each conductor via.

In each configuration example described above, the EBG structure is formed in a dielectric substrate. However, the EBG structure need not always be formed in the dielectric substrate. The above-described EBG structure may be formed in, for example, a high dielectric member such as ceramic. Further, in each configuration example described above, the case in which a transmission line such as a microstrip line is used as the signal line has been described. However, other lines such as a waveguide, a coplanar line, a strip line, and the like may be used as long as they transmit signals. Furthermore, in each configuration example described above, the unit cell structure is arranged under the signal line to cut off the electromagnetic wave. However, the signal line may be arranged in the inner layer portion of the EBG structure as long as it is provided with a clearance or the like so as not to electrically conduct to the unit cell structure. That is, taking FIGS. 4A to 4D as an example, a signal line of a layer between a conductor 403 and a conductor 404 may be formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-008954, filed Jan. 20, 2015 which is hereby incorporated by reference herein in its entirety.

What is claimed is:

1. A structure which cuts off propagation of an electromagnetic wave at one or more frequency bands, the structure comprising:
   a substrate including a first layer, a second layer, a third layer, and a fourth layer, wherein the third layer and the fourth layer are disposed between the first layer and the second layer;
   a first conductor formed on the first layer;
   a second conductor formed on the second layer;
   a plurality of third conductors formed on the third layer; and
   a plurality of fourth conductors formed on the fourth layer,
   wherein one end of a first one of the plurality of third conductors is connected to one end of a first one of the plurality of fourth conductors by a first via, wherein another end of the first one of the plurality of third conductors is connected to one end of a second one of the plurality of fourth conductors by a second via, wherein another end of the second one of the plurality of fourth conductors is connected to one end of a second one of the plurality of third conductors by a third via, wherein another end of the second one of the plurality of third conductors is an open end, and wherein a helical shape with an axis substantially-parallel to the first layer and the second layer is formed by the plurality of third conductors, the plurality of fourth conductors, and a plurality of vias that include the first via, the second via, and the third via.

2. The structure according to claim 1, wherein one of the ends of each of two of the plurality of third conductors is connected to the second conductor.

3. The structure according to claim 1, wherein the open end is arranged between the first conductor and the second conductor.

4. The structure according to claim 1, wherein none of the plurality of third conductors are connected to the second conductor.

5. The structure according to claim 1, wherein the one end of the first one or the second one of the plurality of third conductors is connected to the second conductor.

6. An electronic circuit comprising:
a first conductor configured to form a signal line;
a second conductor configured to form ground;
a substrate including a first layer, a second layer, a third layer, and a fourth layer, wherein the third layer and the fourth layer are disposed between the first layer and the second layer, the first conductor is formed on the first layer and the second conductor is formed on the second layer; and
a structure configured to cut off propagation of an electromagnetic wave at one or more frequency bands,
wherein the structure includes:
a plurality of third conductors formed on the third layer, and
a plurality of fourth conductors formed on the fourth layer,
wherein one end of a first one of the plurality of third conductors is connected to one end of a first one of the plurality of fourth conductors by a first via,
wherein another end of the first one of the plurality of third conductors is connected to one end of a second one of the plurality of fourth conductors by a second via,
wherein another end of the second one of the plurality of fourth conductors is connected to one end of a second one of the plurality of third conductors by a third via,
wherein another end of the second one of the plurality of third conductors is an open end, and
wherein a helical shape with an axis substantially-parallel to the first layer and the second layer is formed by the plurality of third conductors, the plurality of fourth conductors, and a plurality of vias that include the first via, the second via, and the third via.

* * * * *